US012727340B2

(12) United States Patent
Yao et al.

(10) Patent No.: US 12,727,340 B2
(45) Date of Patent: Sep. 1, 2026

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN); BEIJING BOE TECHNOLOGY DEVELOPMENT CO., LTD., Beijing (CN)

(72) Inventors: Liang Yao, Beijing (CN); Ruqin Zhang, Beijing (CN); Pingchuan Zeng, Beijing (CN); Zhimeng Shao, Beijing (CN); Yige Qi, Beijing (CN)

(73) Assignees: CHENGDU BOE OPTOELECTRONICS TECHNOLOGY CO., LTD., Chengdu (CN); BOE TECHNOLOGY GROUP CO. LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 343 days.

(21) Appl. No.: 18/696,851

(22) PCT Filed: Jun. 20, 2023

(86) PCT No.: PCT/CN2023/101371
§ 371 (c)(1),
(2) Date: Mar. 28, 2024

(87) PCT Pub. No.: WO2024/259584
PCT Pub. Date: Dec. 26, 2024

(65) Prior Publication Data

US 2026/0143915 A1 May 21, 2026

(51) Int. Cl.
*H10K 59/122* (2023.01)
*B60K 35/22* (2024.01)
(Continued)

(52) U.S. Cl.
CPC ........... *H10K 59/122* (2023.02); *B60K 35/22* (2024.01); *H10K 59/1201* (2023.02);
(Continued)

(58) Field of Classification Search
None
See application file for complete search history.

(56) References Cited

U.S. PATENT DOCUMENTS

2016/0259219 A1* 9/2016 Oka .................. G02F 1/134363
2021/0116801 A1* 4/2021 Ji .............................. G03F 1/60
(Continued)

FOREIGN PATENT DOCUMENTS

CN 115000136 A 9/2022

*Primary Examiner* — Alexander G Ghyka
(74) *Attorney, Agent, or Firm* — Dilworth & Barrese, LLP.; Michael J. Musella, Esq.

(57) ABSTRACT

A display panel, a manufacturing method thereof, and a display device are provided. The display panel, including a plurality of pixels located on a base substrate, each of the plurality of pixels includes a plurality of sub-pixels, and each of the plurality of sub-pixels has a pixel opening, the plurality of sub-pixels include a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets: Dmax/Dmin≤y, y=0.02*Dmin+0.85, where y is a coefficient.

20 Claims, 20 Drawing Sheets

(51) Int. Cl.
*H10K 59/12* (2023.01)
*H10K 59/38* (2023.01)
*H10K 59/80* (2023.01)

(52) U.S. Cl.
CPC ........... *H10K 59/38* (2023.02); *H10K 59/873* (2023.02); *H10K 59/8792* (2023.02); *B60K 2360/1523* (2024.01)

(56) References Cited

U.S. PATENT DOCUMENTS

| | | | | |
|---|---|---|---|---|
| 2021/0183965 | A1* | 6/2021 | Wang | H10K 59/352 |
| 2022/0037426 | A1* | 2/2022 | Huang | H10K 59/35 |
| 2022/0238611 | A1* | 7/2022 | Mao | G02F 1/133514 |
| 2022/0262873 | A1* | 8/2022 | Han | C23C 14/042 |
| 2023/0088068 | A1* | 3/2023 | Han | H10K 59/353 257/40 |
| 2023/0095066 | A1* | 3/2023 | Kim | H10K 59/879 257/91 |
| 2024/0341150 | A1* | 10/2024 | Huangfu | G02F 1/133514 |

* cited by examiner

DISPLAY PANEL, MANUFACTURING METHOD THEREOF, AND DISPLAY DEVICE

TECHNICAL FIELD

Embodiments of the present disclosure relate to a display panel, a manufacturing method thereof, and a display device.

BACKGROUND

An active-matrix organic light-emitting diode (AMOLED) display device has the advantages of self-Illumination (with no need for a backlight), simple structure, wide viewing angle, low power consumption, flexible display, and the like, and is one of currently most promising display techniques.

Recently, with the continuous innovation and development of large-size rollable OLED display panels, the requirement on low power consumption is increasingly enhanced in the display field. The power consumption can be effectively reduced by increasing the transmittance of an upper-layer component over a light-emitting layer. Using the Color Filter on Encapsulation (COE) solution instead of a Polarizer (POL) structure is an effective method for increasing the transmittance, which may obtain a thinner display panel module and is also conducive to further development of a rollable screen.

SUMMARY

Embodiments of the present disclosure provide a display panel, a manufacturing method thereof, and a display device.

Embodiments of the present disclosure provide a display panel, including a plurality of pixels located on a base substrate, each of the plurality of pixels includes a plurality of sub-pixels, and each of the plurality of sub-pixels has a pixel opening, the plurality of sub-pixels include a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets: $Dmax/Dmin \leq y$, $y=0.02*Dmin+0.85$, where y is a coefficient.

According to the display panel provided by an embodiment of the present disclosure, the sub-pixel includes a light-emitting element, and a size of the pixel opening is D, the display panel further includes an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate in a length direction or a width direction of the display panel is D2, an offset distance of light emitted from the light-emitting element is D1, and the display panel meets:

$$\alpha = \frac{D1 - D2}{D},$$

where α refers to an extent to which the light emitted from the light-emitting element is influenced by the black matrix.

According to the display panel provided by an embodiment of the present disclosure, the display panel meets: $L_{\varphi 1}=(1-\alpha)*L_{\varphi 0}$, where $L_{\varphi 1}$ refers to a luminance of the display panel, and $L_{\varphi 0}$ refers to a luminance of a structure obtained by removing the black matrix and the color filter layer from the display panel.

According to the display panel provided by an embodiment of the present disclosure, $$D1 = \sum_{L1}^{Ln} d_i \tan\theta_i,$$

where L1 refers to a film layer closest to a light-exiting side of the light-emitting element, Ln refers to the color filter layer, $d_i$ refers to a thickness of the $i^{th}$ film layer between the film layer L1 and the film layer Ln, $\theta_i$ refers to a refraction angle of light incident on the $i^{th}$ film layer, $1<i<n$, and $n>i$, i is a positive integer greater than 1, and n is a positive integer greater than 2.

According to the display panel provided by an embodiment of the present disclosure, the size of the pixel opening is a length, a diameter, or an area of the pixel opening.

According to the display panel provided by an embodiment of the present disclosure, a shape of the pixel opening includes a rectangle, a rounded rectangle, or a circle.

According to the display panel provided by an embodiment of the present disclosure, the first sub-pixel, the second sub-pixel, and the third sub-pixel are configured to emit light different in color.

According to the display panel provided by an embodiment of the present disclosure, the size D of the pixel opening of the first sub-pixel is different from the size D of the pixel opening of the second sub-pixel, the offset distance D1 of the first sub-pixel is different from the offset distance D1 of the second sub-pixel, and the distance D2 of the first sub-pixel is different from the distance D2 of the second sub-pixel.

According to the display panel provided by an embodiment of the present disclosure, compared with a luminance at 0° viewing angle, a luminance at 30° viewing angle has a luminance decay of less than or equal to 26%.

According to the display panel provided by an embodiment of the present disclosure, compared with initial operation, a color difference of a white screen is less than 2.5 JNCD after the display panel operates for 300 hours.

According to the display panel provided by an embodiment of the present disclosure, the display panel further includes a pixel defining layer, the pixel defining layer is configured to define the pixel opening and includes a pixel segmenting portion, and an orthographic projection of the pixel segmenting portion on the base substrate overlaps an orthographic projection of the pixel opening of the sub-pixel having the maximum size on the base substrate.

According to the display panel provided by an embodiment of the present disclosure, the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, the first direction is perpendicular to the second direction.

According to the display panel provided by an embodiment of the present disclosure, the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, the first direction is perpendicular to the second direction.

According to the display panel provided by an embodiment of the present disclosure, the first gap is larger than the second gap.

According to the display panel provided by an embodiment of the present disclosure, the first gap is in a range of 5-10 μm, and the second gap is in a range of 3-5 μm.

According to the display panel provided by an embodiment of the present disclosure, the pixel opening of the sub-pixel having the maximum size is rectangular.

According to the display panel provided by an embodiment of the present disclosure, a size of a long edge of the pixel opening of the sub-pixel having the maximum size is greater than 30 μm.

According to the display panel provided by an embodiment of the present disclosure, the light-emitting element includes a first light-emitting element, a second light-emitting element, and a third light-emitting element, the first light-emitting element includes a first light-emitting layer and a first color shift adjustment layer, the second light-emitting element includes a second light-emitting layer and a second color shift adjustment layer, and the third light-emitting element includes a third light-emitting layer.

According to the display panel provided by an embodiment of the present disclosure, a thickness of the first color shift adjustment layer is 50-100 nm and a thickness of the second color shift adjustment layer is 25-40 nm, the third light-emitting element further includes a third color shift adjustment layer, and a thickness of the third color shift adjustment layer is greater than 0 and less than or equal to 15 nm.

According to the display panel provided by an embodiment of the present disclosure, the first sub-pixel and the third sub-pixel are located on a same side of the second sub-pixel, the pixel opening of the second sub-pixel is larger than the pixel opening of the first sub-pixel and larger than the pixel opening of the third sub-pixel, the display panel further includes a pixel defining layer, the pixel defining layer is configured to define the pixel opening and includes a pixel segmenting portion, an orthographic projection of the pixel segmenting portion on the base substrate overlaps an orthographic projection of the pixel opening of the sub-pixel having the maximum size on the base substrate, the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, or the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, the first direction is perpendicular to the second direction.

According to the display panel provided by an embodiment of the present disclosure, a size of the opening of the black matrix is greater than 0 and less than or equal to 2 μm.

According to the display panel provided by an embodiment of the present disclosure, at 0° viewing angle, the luminance of the display panel is SS, and at a same viewing angle, the luminance of the display panel in a vertical direction is SS1, while the luminance of the display panel in a horizontal direction is SS2, and SS1/SS is greater than SS2/SS.

According to the display panel provided by an embodiment of the present disclosure, in the horizontal direction, the luminance at a viewing angle of greater than 35° decays to below 5% of the luminance at 0° viewing angle.

According to the display panel provided by an embodiment of the present disclosure, the sub-pixel includes a light-emitting element, and a size of the pixel opening is D, the display panel further includes an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and values of at least two of the distance D2 of the first sub-pixel, the distance D2 of the second sub-pixel, and the distance D2 of the third sub-pixel are different.

Embodiment of the present disclosure further provides a vehicle-mounted display panel, including a plurality of pixels, each of the plurality of pixels includes a plurality of sub-pixels, and each of the plurality of sub-pixels has a pixel opening, the plurality of sub-pixels include a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets: $Dmax/Dmin \leq y$, $y=0.02*Dmin+0.85$, where y is a coefficient.

According to the vehicle-mounted display panel provided by an embodiment of the present disclosure, the sub-pixel includes a light-emitting element, and a size of the pixel opening is D, the vehicle-mounted display panel further includes an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and an offset distance of light emitted from the light-emitting element is D1, and the vehicle-mounted display panel meets:

$$\alpha = \frac{D1 - D2}{D},$$

where α refers to an extent to which the light emitted from the light-emitting element is influenced by the black matrix.

According to the vehicle-mounted display panel provided by an embodiment of the present disclosure, the vehicle-mounted display panel meets: $L_{\varphi 1}=(1-\alpha)*L_{\varphi 0}$, where $L_{\varphi 1}$ refers to a luminance of the vehicle-mounted display panel, and $L_{\varphi 0}$ refers to a luminance of a structure obtained by removing the black matrix and the color filter layer from the vehicle-mounted display panel.

According to the vehicle-mounted display panel provided by an embodiment of the present disclosure, $$D1 = \sum_{L1}^{Ln} d_i \tan\theta_i,$$

where L1 refers to a film layer closest to a light-exiting side of the light-emitting element, Ln refers to the color filter layer, $d_i$ refers to a thickness of the $i^{th}$ film layer between the film layer L1 and the film layer Ln, $\theta_1$ refers to a refraction angle of light incident on the $i^{th}$ film layer, $1<i<n$, and $n>i$, i is a positive integer greater than 1, and n is a positive integer greater than 2.

According to the vehicle-mounted display panel provided by an embodiment of the present disclosure, the size of the pixel opening is a length, a diameter, or an area of the pixel opening.

According to the vehicle-mounted display panel provided by an embodiment of the present disclosure, a shape of the pixel opening includes a rectangle, a rounded rectangle, or a circle.

According to the vehicle-mounted display panel provided by an embodiment of the present disclosure, the first sub-pixel, the second sub-pixel, and the third sub-pixel are configured to emit light different in color.

According to the vehicle-mounted display panel provided by an embodiment of the present disclosure, compared with a luminance at 0° viewing angle, a luminance at 30° viewing angle has a luminance decay of less than or equal to 26%.

According to the vehicle-mounted display panel provided by an embodiment of the present disclosure, compared with initial operation, a color difference of a white screen is less than 2.5 JNCD after the vehicle-mounted display panel operates for 300 hours.

According to the vehicle-mounted display panel provided by an embodiment of the present disclosure, the vehicle-mounted display panel further includes a pixel defining layer, the pixel defining layer is configured to define the pixel opening and includes a pixel segmenting portion, and an orthographic projection of the pixel segmenting portion on the base substrate overlaps an orthographic projection of the pixel opening of the sub-pixel having the maximum size on the base substrate.

According to the vehicle-mounted display panel provided by an embodiment of the present disclosure, the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, the first direction is perpendicular to the second direction.

According to the vehicle-mounted display panel provided by an embodiment of the present disclosure, the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, the first direction is perpendicular to the second direction.

According to the vehicle-mounted display panel provided by an embodiment of the present disclosure, the first gap is larger than the second gap.

According to the vehicle-mounted display panel provided by an embodiment of the present disclosure, the first gap is in a range of 5-10 μm, and the second gap is in a range of 3-5 μm.

According to the vehicle-mounted display panel provided by an embodiment of the present disclosure, the pixel opening of the sub-pixel having the maximum size is rectangular.

According to the vehicle-mounted display panel provided by an embodiment of the present disclosure, a size of a long edge of the pixel opening of the sub-pixel having the maximum size is greater than 30 μm.

According to the vehicle-mounted display panel provided by an embodiment of the present disclosure, a size of the opening of the black matrix is greater than 0 and less than or equal to 2 μm.

According to the vehicle-mounted display panel provided by an embodiment of the present disclosure, at a viewing angle of a same value, a luminance decay in a vertical direction is less than a luminance decay in a horizontal direction.

According to the vehicle-mounted display panel provided by an embodiment of the present disclosure, in the horizontal direction, the luminance at a viewing angle of greater than 35° decays to below 5% of the luminance at 0° viewing angle.

According to the vehicle-mounted display panel provided by an embodiment of the present disclosure, the sub-pixel includes a light-emitting element, and a size of the pixel opening is D, the vehicle-mounted display panel further includes an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and values of at least two of the distance D2 of the first sub-pixel, the distance D2 of the second sub-pixel, and the distance D2 of the third sub-pixel are different.

Embodiments of the present disclosure further provide a display device, including any one of the display panels or any one of the vehicle-mounted display panels as described above.

Embodiments of the present disclosure further provide a manufacturing method of a display panel, including forming a plurality of pixels, forming each of the plurality of pixels includes forming a plurality of sub-pixels, and each of the plurality of sub-pixels has a pixel opening, the plurality of sub-pixels include a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets: $Dmax/Dmin \leq y$, $y=0.02*Dmin+0.85$, where y is a coefficient.

According to the manufacturing method of the display panel provided by an embodiment of the present disclosure, the sub-pixel includes a light-emitting element, and a size of the pixel opening is D, the manufacturing method of the display panel further includes forming an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and an offset distance of light emitted from the light-emitting element is D1, and the manufacturing method of the display panel meets:

$$\alpha = \frac{D1 - D2}{D},$$

where α refers to an extent to which the light emitted from the light-emitting element is influenced by the black matrix.

According to the manufacturing method of the display panel provided by an embodiment of the present disclosure, the manufacturing method of the display panel meets: $L_{\varphi 1}=(1-\alpha)*L_{\varphi 0}$, where $L_{\varphi 1}$ refers to a luminance of the display panel obtained by the manufacturing method, and $L_{\varphi 0}$ refers to a luminance of a structure obtained by removing the black matrix and the color filter layer in the manufacturing method of the display panel.

According to the manufacturing method of the display panel provided by an embodiment of the present disclosure, $$D1 = \sum_{L1}^{Ln} d_i \tan\theta_i,$$

where L1 refers to a film layer closest to a light-exiting side of the light-emitting element, Ln refers to the color filter layer, $d_i$ refers to a thickness of the $i^{th}$ film layer between the film layer L1 and the film layer Ln, $\theta_i$ refers to a refraction angle of light incident on the $i^{th}$ film layer, $1<i<n$, and $n>i$, i is a positive integer greater than 1, and n is a positive integer greater than 2.

According to the manufacturing method of the display panel provided by an embodiment of the present disclosure, the size of the pixel opening is a length, a diameter, or an area of the pixel opening.

According to the manufacturing method of the display panel provided by an embodiment of the present disclosure, a shape of the pixel opening includes a rectangle, a rounded rectangle, or a circle.

According to the manufacturing method of the display panel provided by an embodiment of the present disclosure, the first sub-pixel, the second sub-pixel, and the third sub-pixel are configured to emit light different in color.

According to the manufacturing method of the display panel provided by an embodiment of the present disclosure, compared with a luminance at 0° viewing angle, a luminance at 30° viewing angle has a luminance decay of less than or equal to 26%.

According to the manufacturing method of the display panel provided by an embodiment of the present disclosure, compared with initial operation, a color difference of a white screen is less than 2.5 JNCD after the display panel obtained by the manufacturing method runs for 300 hours.

According to the manufacturing method of the display panel provided by an embodiment of the present disclosure, the manufacturing method further includes forming a pixel defining layer, the pixel defining layer is configured to define the pixel opening and includes a pixel segmenting portion, and an orthographic projection of the pixel segmenting portion on the base substrate overlaps an orthographic projection of the pixel opening of the sub-pixel having the maximum size on the base substrate.

According to the manufacturing method of the display panel provided by an embodiment of the present disclosure, the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, the first direction is perpendicular to the second direction.

According to the manufacturing method of the display panel provided by an embodiment of the present disclosure, the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, the first direction is perpendicular to the second direction.

According to the manufacturing method of the display panel provided by an embodiment of the present disclosure, the first gap is larger than the second gap.

According to the manufacturing method of the display panel provided by an embodiment of the present disclosure, the first gap is in a range of 5-10 μm, and the second gap is in a range of 3-5 μm.

According to the manufacturing method of the display panel provided by an embodiment of the present disclosure, the pixel opening of the sub-pixel having the maximum size is rectangular.

According to the manufacturing method of the display panel provided by an embodiment of the present disclosure, a size of a long edge of the pixel opening of the sub-pixel having the maximum size is greater than 30 μm.

According to the manufacturing method of the display panel provided by an embodiment of the present disclosure, a size of the opening of the black matrix is greater than 0 and less than or equal to 2 μm.

According to the manufacturing method of the display panel provided by an embodiment of the present disclosure, at a viewing angle of a same value, a luminance decay in a vertical direction is less than a luminance decay in a horizontal direction.

According to the manufacturing method of the display panel provided by an embodiment of the present disclosure, in the horizontal direction, the luminance at a viewing angle of greater than 35° decays to below 5% of the luminance at 0° viewing angle.

According to the manufacturing method of the display panel provided by an embodiment of the present disclosure, the sub-pixel includes a light-emitting element, and a size of the pixel opening is D, the manufacturing method of the display panel further includes forming an encapsulation layer, a black matrix, and a color filter layer, the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and values of at least two of the distance D2 of the first sub-pixel, the distance D2 of the second sub-pixel, and the distance D2 of the third sub-pixel are different.

BRIEF DESCRIPTION OF THE DRAWINGS

In order to more clearly illustrate the technical solutions of the embodiments of the present disclosure, the drawings of the embodiments will be briefly described in the following, it is obvious that the described drawings below are only related to some embodiments of the present disclosure and thus are not limitative to the present disclosure.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1A:
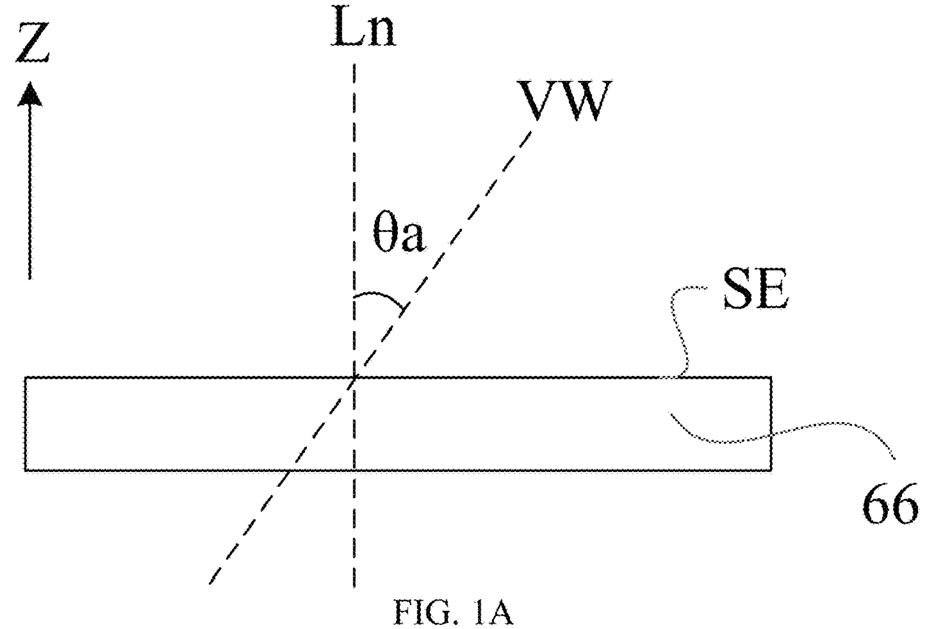
FIG. 1A is a schematic diagram of a viewing angle of a display panel.
Figure 1B:
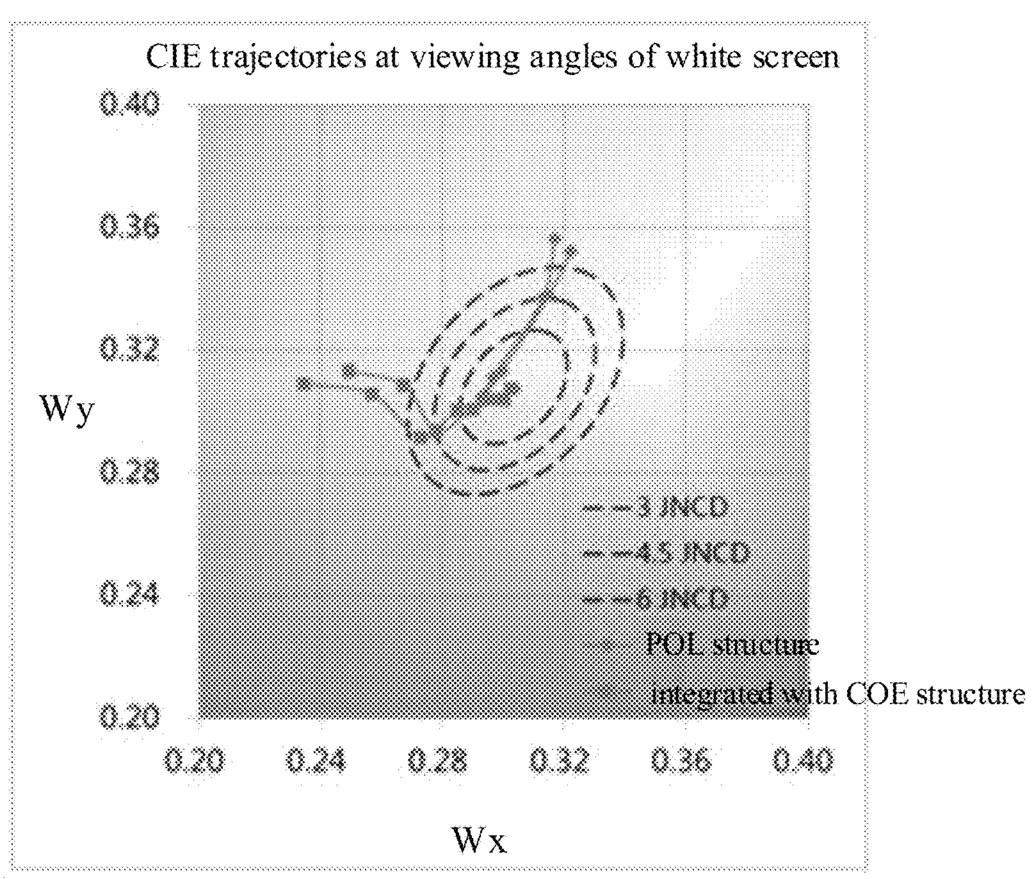
FIG. 1B is a diagram illustrating Commission Internationale de L'Eclairage (CIE) trajectories at viewing angles of white screen.
Figure 1C:
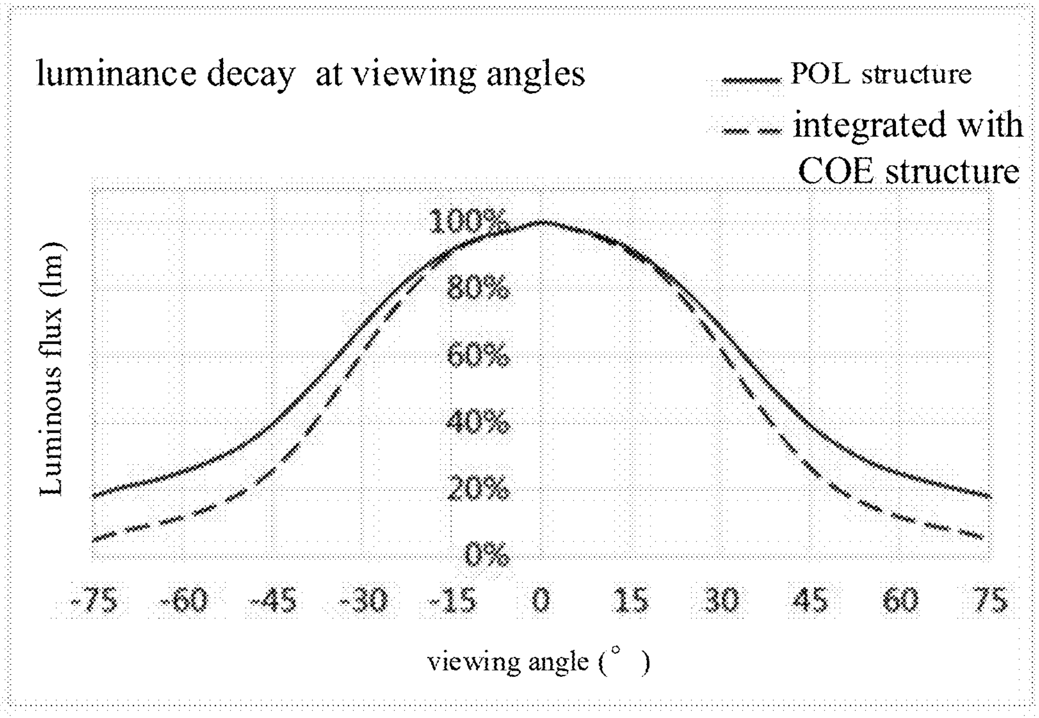
FIG. 1C is a diagram illustrating a comparison on properties at viewing angles between an OLED display panel of a POL structure and an OLED display panel integrated with a COE structure.

The inventor(s) found that the properties at viewing angles of an OLED display panel will degrade seriously after a COE structure is introduced therein. FIG. 1A is a schematic diagram of a viewing angle of a display panel. FIG. 1B is a diagram illustrating CIE trajectories at viewing angles of white screen. FIG. 1C is a diagram illustrating a comparison on properties at viewing angles between an OLED display panel of a POL structure and an OLED display panel integrated with a COE structure.

As shown in FIG. 1A, the display panel 66 has a light exit surface SE and a normal line Ln. The normal line Ln is perpendicular to the light exit surface SE. An included angle between a line of sight VW and the normal line Ln is a viewing angle θa.

As shown in FIG. 1B, three dotted circles refer to, from inside to outside, trajectories with a color difference of 3 JNCD, a color difference of 4.5 JNCD, and a color difference of 6 JNCD, respectively. As shown in FIG. 1B, at a large viewing angle, the display panel of the POL structure has a smaller color difference than the display panel integrated with the COE structure. As shown in FIG. 1B, the smaller the viewing angle, the closer the rectangular points to the dotted circle with the color difference of 3 JNCD. As shown in FIG. 1B, the larger the viewing angle, the greater the color difference of the display panel.

Just Noticeable Color Difference (JNCD) is utilized to reflect a color shift degree, and the smaller the value thereof, the smaller the color shift and the more accurate the color display. For example, JNCD refers to a difference between two color coordinates.

As shown in FIG. 1C, at the same viewing angle, the display panel of the POL structure has a smaller luminance decay degree than the display panel integrated with the COE structure. As shown in FIG. 1C, at the same viewing angle, a luminance decay degree of the display panel of the POL structure is smaller than that of the display panel integrated with the COE structure.

As shown in FIG. 1B and FIG. 1C, both of a color shift at a viewing angle and a luminance decay at a viewing angle for the OLED display panel integrated with the COE structure become worse mainly because a Black Matrix (BM) absorbs and blocks light. The black matrix may block sub-pixels of different colors to different extents.

Embodiments of the present disclosure provide a display panel integrated with a COE structure, a manufacturing method thereof, and a display device. The problem of degradation of the properties at viewing angles of the display panel due to the introduction of the COE structure may be effectively improved, and the display panel with good optical properties at viewing angles can be obtained.

Figure 2A:
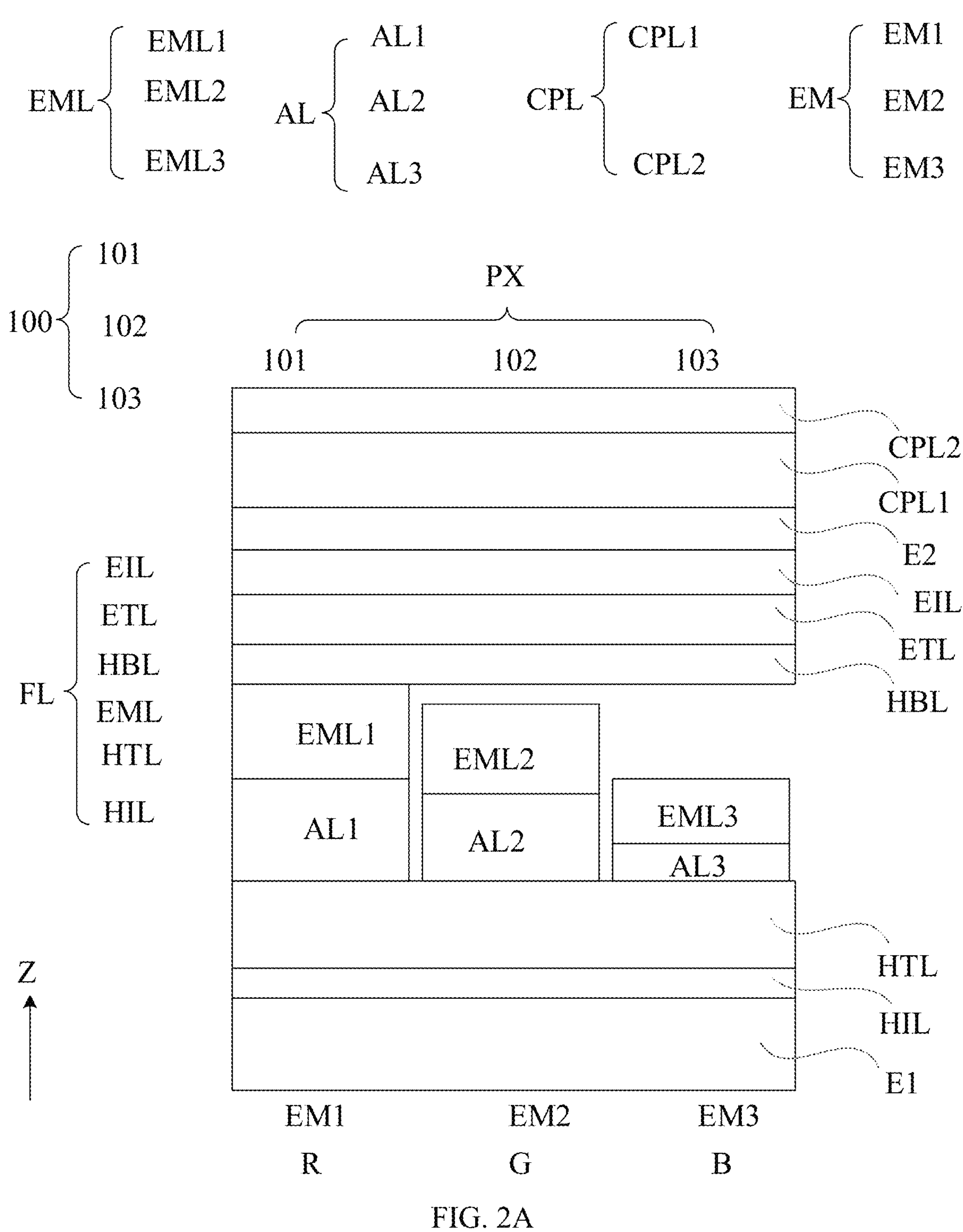
FIG. 2A is a schematic diagram of sub-pixels of a display panel.
Figure 2B:
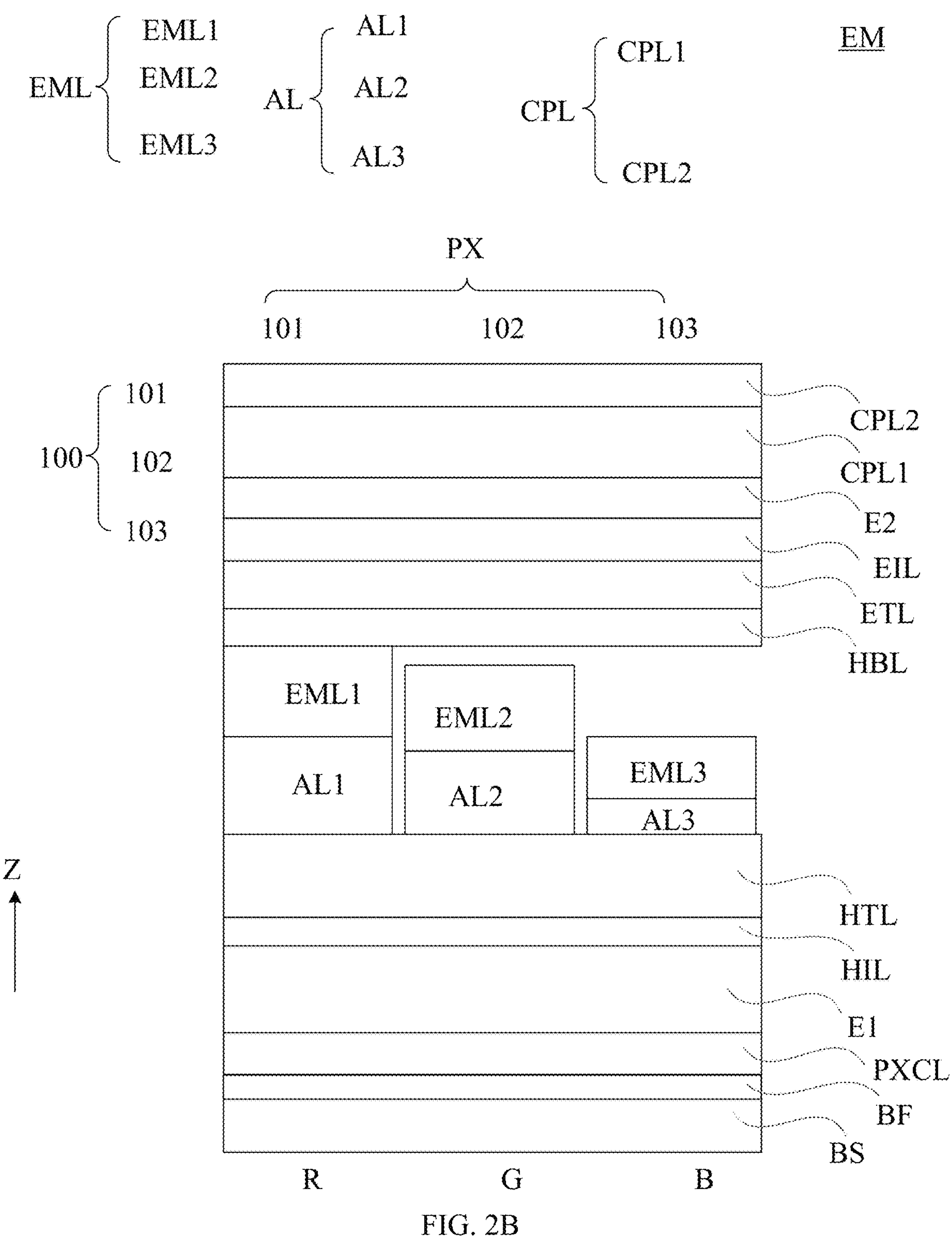
FIG. 2B is a schematic diagram of sub-pixels of another display panel.
Figures 2C, 3:
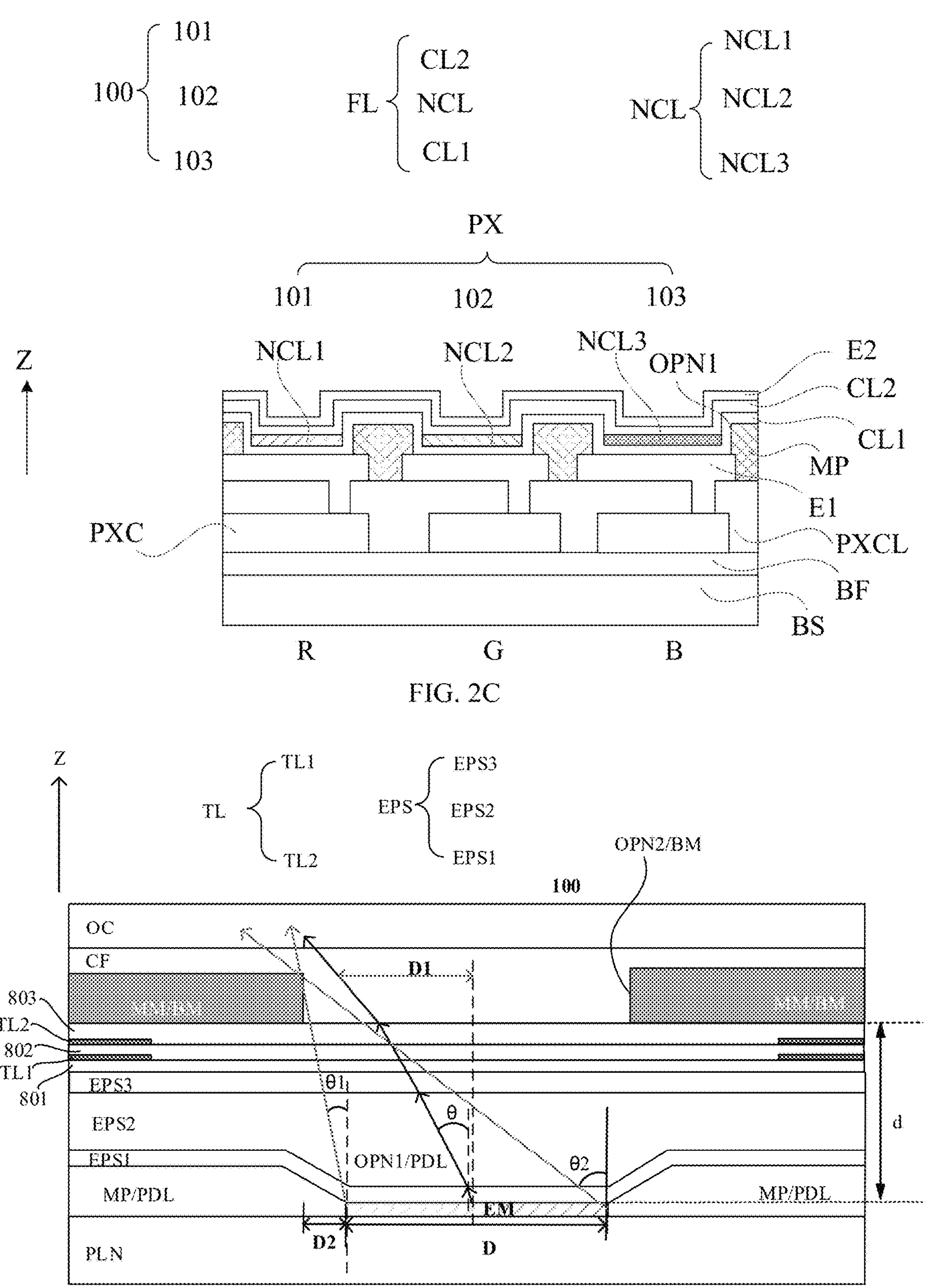
FIG. 2C is a schematic diagram of sub-pixels of another display panel.
FIG. 3 is a schematic diagram of a principle of influencing a luminance decay at a viewing angle for a display panel integrated with a COE structure (a cross-sectional view of the display panel).

FIG. 2A is a schematic diagram of sub-pixels of a display panel. FIG. 2B is a schematic diagram of sub-pixels of another display panel. FIG. 2C is a schematic diagram of sub-pixels of another display panel.

As shown in FIG. 2A to FIG. 2C, the display panel includes a pixel PX. FIG. 3 illustrates one pixel PX of a plurality of pixels in a display panel. The pixel PX includes a plurality of sub-pixels 100. The plurality of pixels 100 include a first sub-pixel 101, a second sub-pixel 102, and a third sub-pixel 103.

As shown in FIG. 2A to FIG. 2B, the sub-pixel 100 includes a light-emitting element EM. The light-emitting element EM includes a first electrode E1, a second electrode E2, and a light-emitting functional layer FL located between the first electrode E1 and the second electrode E2.

FIG. 2A to FIG. 2C illustrate a first light-emitting element EM1, a second light-emitting element EM2, and a third light-emitting element EM3.

As shown in FIG. 2A to FIG. 2C, the light-emitting functional layer FL includes a light-emitting layer EML. The light-emitting layer EML includes a first light-emitting layer EML1, a second light-emitting layer EML2, and a third light-emitting layer EML3. The first light-emitting layer EML1, the second light-emitting layer EML2, and the third light-emitting layer EML3 are non-common layers NCL.

For example, as shown in FIG. 2A and FIG. 2B, a thickness of the first light-emitting layer EML1 is in a range from 35 nm to 55 nm, a thickness of the second light-emitting layer EML2 is in a range from 25 nm to 40 nm, and a thickness of the third light-emitting layer EML3 is in a range from 15 nm to 35 nm.

As shown in FIG. 2C, the non-common layers NCL include a first non-common layer NCL1, a second non-common layer NCL2, and a third non-common layer NCL3. As shown in FIG. 2C, the first non-common layer NCL1 may include the first light-emitting layer EML1, the second non-common layer NCL2 may include the second light-emitting layer EML2, and the third non-common layer NCL3 may include the third light-emitting layer EML3.

As shown in FIG. 2A to FIG. 2C, the sub-pixel 100 further includes a color shift adjustment layer AL. The color shift adjustment layer AL may include a first color shift adjustment layer AL1, a second color shift adjustment layer AL2, and a third color shift adjustment layer AL3. The first color shift adjustment layer AL1, the second color shift adjustment layer AL2, and the third color shift adjustment layer AL3 are non-common layers NCL. The color shift adjustment layers AL are provided to reduce a color shift at a viewing angle.

For example, color coordinates, color shifts, and the like may be adjusted to optimal levels by adjusting the thicknesses of the color shift adjustment layer AL. For example, the color shift adjustment layer AL may be made of an organic material, e.g., an organic small molecular material. The color shift adjustment layer AL may be made of a common material, which will not be limited herein.

For example, the thickness of the first color shift adjustment layer AL1 is 800 Å, the thickness of the second color shift adjustment layer AL2 is 400 Å, and the thickness of the third color shift adjustment layer AL3 is 850 Å.

As shown in FIG. 2A and FIG. 2B, the thickness of the first color shift adjustment layer AL1 is in a range from 50 nm to 100 nm, the thickness of the second color shift adjustment layer AL2 is in a range from 25 nm to 40 nm, and the thickness of the third color shift adjustment layer AL3 is in a range from 0 nm to 15 nm.

As shown in FIG. 2A to FIG. 2C, in the light-emitting element EM, the light-emitting functional layer FL further includes a hole injection layer HIL, a hole transport layer HTL, a hole blocking layer HBL, an electron transport layer ETL, and an electron injection layer EIL. As a matter of course, the light-emitting functional layer FL may also take other suitable structure, which will not be defined herein.

As shown in FIG. 2A to FIG. 2C, in some embodiments, a thickness of the hole injection layer HIL is in a range from 0 nm to 20 nm, a thickness of the hole transport layer HTL is in a range from 70 nm to 150 nm, a thickness of the hole blocking layer HBL is in a range from 0 nm to 20 nm, a thickness of the electron transport layer ETL is in a range from 15 nm to 50 nm, a thickness of the electron injection layer EIL is in a range from 0 nm to 5 nm, and a thickness of the second electrode E2 is in a range from 7 nm to 30 nm.

In an embodiment of the present disclosure, a film layer having a thickness of 0 indicates that the film layer is not provided.

FIG. 2A and FIG. 2B further illustrate a light extraction layer CPL1. The light extraction layer CPL1 is located on the second electrode E2. For example, a thickness of the light extraction layer CPL1 is in a range from 50 nm to 100 nm.

FIG. 2A and FIG. 2B further illustrate a functional film layer CPL2. The functional film layer CPL2 is located on the light extraction layer CPL1.

For example, a material of the light extraction layer CPL1 includes, but is not limited to, an organic material.

For example, a material of the functional film layer CPL2 includes an organic material or an inorganic material. The organic material may include poly(3,4-ethylenedioxythiophene) (PEDOT) and the inorganic material may include silicon oxide or lithium fluoride (LiF), without limitation thereto.

For example, as shown in FIG. 2A and FIG. 2B, a refractive index of the light extraction layer CPL1 is greater than that of the functional film layer CPL2. That is, the light extraction layer CPL1 is made of a material with a high refractive index, while the functional film layer CPL2 is made of a material with a low refractive index. A better light-exiting effect can be achieved with the combination of high and low refractive indexes of the light extraction layer CPL1 and the functional film layer CPL2. For example, as shown in FIG. 2A and FIG. 2B, the light extraction layer CPL1 and the functional film layer CPL2 may be referred to as capping layers. The capping layers are located over the second electrode E2.

FIG. 2B and FIG. 2C illustrate a base substrate BS, a buffer layer BF located on the base substrate BS, and a pixel circuit layer PXCL located on the buffer layer BF. The pixel circuit layer PXCL includes a plurality of pixel circuits PXC. The first electrode E1 of the light-emitting element EM is connected to the pixel circuit PXC. The pixel circuit PXC is configured to drive the light-emitting element EM connected thereto to emit light. The light-emitting element EM may be independently controlled by the pixel circuit PXC connected thereto.

As shown in FIG. 2C, a pixel defining layer PDL includes a main body portion MP and a plurality of pixel openings OPN1. The main body portion MP of the pixel defining layer PDL is configured to expose at least part of the first electrode E1 of the light-emitting element EM. The light-emitting element EM or a light-emitting zone of the sub-pixel 100 correspond to a region where the pixel opening OPN1 is located.

As shown in FIG. 2C, the light-emitting functional layer FL includes a common layer CL1, a non-common layer NCL, and a common layer CL2. Referring to FIG. 2A to FIG. 2C, the common layer CL1 may include the hole injection layer HIL and the hole transport layer HTL. The non-common layer NCL may include the light-emitting layer EML. The non-common layer NCL may further include the color shift adjustment layer AL. The common layer CL2 may include the hole blocking layer HBL, the electron transport layer ETL, and the electron injection layer EIL. As a matter of course, in other embodiments, the common layer CL1, the non-common layer NCL, and the common layer CL2 may be provided as needed.

Currently used light-emitting elements, e.g., OLEDs, mostly take a top-emitting device structure. A reflective first electrode E1 (a positive electrode) and a semi-transparent second electrode E2 (a negative electrode) are used to enhance the light-exiting efficiency by means of the microcavity effect.

According to the properties of the light-emitting element, the spectrum of the light-emitting element at a viewing angle may have a blue shift. A microcavity enhanced spectrum is called an EL spectrum for short, and an intrinsic spectrum of a material is called a PL spectrum for short, and a relationship between them is as follows:

$$EL(\lambda) = PL(\lambda) * Gcav.\ (\lambda),$$

where Gcav.(λ) is a microcavity gain.

A formula of the microcavity gain is as follows.

$$G_{cav.}(\lambda) = \left|\frac{\sum \tilde{\psi}_{cav.}}{2\tilde{\psi}_{Ao1}}\right|^2 \frac{\tau_{cav.}}{\tau_{con.}} = \frac{(1 - R_2 - A_2)\left[1 + R_1 + 2R_1^{0.5}\cos\left(\frac{4\pi nx\cos\theta}{\lambda} + \varphi_{BM}\right)\right]}{4\left[1 + R_1R_2 - 2(R_1R_2)^{0.5}\cos\left(\frac{4\pi nL\cos\theta}{\lambda} + \varphi_M\right)\right]} \frac{\tau_{cav.}}{\tau_{con.}},$$

where $\tau_{cav.}$ and $\tau_{con.}$ correspond to lifetimes of molecular excited state of an organic material in microcavity and free space, respectively; $R_2$ refers to a reflectance of a light-exiting mirror surface; $R_1$ refers to a reflectance of a total reflection mirror surface (the first electrode E1); $A_2$ refers to an absorptivity of the light-exiting mirror surface; $(1-R_2-A_2)$ refers to a transmittance of the light-exiting mirror surface; θ refers to a light-exiting angle; x refers to a distance from a light source to the total reflection mirror surface (the first electrode E1, the positive electrode); $\phi_{BM}$ refers to a phase at the total reflection mirror surface (the first electrode E1, the positive electrode); $\phi_M$ refers to a phase at the light-exiting mirror surface (the second electrode E2, the negative electrode); L refers to a microcavity length (a physical length from the first electrode E1 to the second electrode E2, i.e., a physical length from the positive electrode to the negative electrode); n refers to a refractive index; and λ refers to a peak wavelength of light. The light-exiting mirror surface refers to a surface, close to the first electrode E1, of the second electrode E2 (the negative electrode), i.e., a lower surface of the second electrode E2 (the negative electrode). As can be seen from the formula of the microcavity gain, the strength of the microcavity gain decreases with increasing angle. Because the intrinsic spectrum of the material remains unchanged, according to a formula of a relationship of the EL spectrum, the PL spectrum, and the microcavity gain, as the angle increases, the strength of the EL spectrum decreases, and the luminance of the display panel at a viewing angle decays.

FIG. 3 is a schematic diagram of a principle of influencing a luminance decay at a viewing angle for a display panel integrated with a COE structure. FIG. 3 is a cross-sectional view of the display panel. FIG. 3 is a vertical cross-sectional view of the display panel. As shown in FIG. 3, the light-emitting element EM is located on a planarization layer PLN. An encapsulation layer EPS is configured to encapsulate the light-emitting element EM to avoid invasion of water and oxygen.

As shown in FIG. 3, the encapsulation layer EPS includes a first encapsulation thin-film EPS1, a second encapsulation thin-film EPS2, and a third encapsulation thin-film EPS3. For example, the first encapsulation thin-film EPS1 and the third encapsulation thin-film EPS3 may be inorganic insulating material layers, and the second encapsulation thin-film EPS2 may be an organic insulating material layer. For example, the inorganic insulating material layer includes, but is not limited to, at least one of silicon oxide, silicon nitride, or silicon oxynitride. For example, the organic insulating material layer includes, but is not limited to, a resin. For example, the first encapsulation thin-film EPS1 and the third encapsulation thin-film EPS3 may be manufactured by using a chemical vapor deposition process. For example, the second encapsulation thin-film EPS2 may be manufactured by using an inkjet printing process. For example, the encapsulation layer EPS may also be referred to as a thin-film encapsulation layer.

As shown in FIG. 3, a touch structure TL is located on an insulating layer 801. The touch structure TL includes a first touch layer TL1 and a second touch layer TL2. An insulating layer 802 is disposed between the first touch layer TL1 and the second touch layer TL2.

As shown in FIG. 3, an insulating layer 803 is disposed on the touch structure TL, and a black matrix BM is located on the insulating layer 803.

As shown in FIG. 3, the black matrix BM has a main body portion MM and an opening OPN2.

As shown in FIG. 3, the opening OPN2 of the black matrix BM is filled with a color filter layer CF.

As shown in FIG. 3, a transparent insulating layer OC is located on the color filter layer CF.

As shown in FIG. 3, a size of the pixel opening OPN1 is D. An orthographic projection of the pixel opening OPN1 on the base substrate BS falls within an orthographic projection of the opening of the black matrix BM on the base substrate BS, and a distance between the orthographic projection of the pixel opening OPN1 on the base substrate BS and the orthographic projection of the opening of the black matrix BM on the base substrate BS is D2. An offset distance of light emitted from the light-emitting element EM is D1. For example, the distance D2 is a size in a length direction or a width direction of the display panel. For example, the distance D2 is a maximum distance, and naturally, may also be a minimum distance. That is, the maximum distance between the orthographic projection of the pixel opening OPN1 on the base substrate BS and the orthographic projection of the opening of the black matrix BM on the base substrate in the length direction or the width direction of the display panel is D2. The embodiment of the present disclosure is illustrated by taking as an example that the maximum distance between the orthographic projection of the pixel opening OPN1 on the base substrate BS and the orthographic projection of the opening of the black matrix BM on the base substrate in the length direction or the width direction of the display panel is D2.

There are three factors influencing a luminance decay at a viewing angle: the size D of the pixel opening OPN1, the offset distance D1 of light emitted from the light-emitting element EM, and the distance D2 between the orthographic projection of the pixel opening OPN1 on the base substrate BS and the orthographic projection of the opening of the black matrix BM on the base substrate BS.

FIG. 3 illustrates a light-exiting angle θ1, a light-exiting angle θ2, and a light-exiting angle θ of the light-emitting element EM. At different positions of the same light-emitting element EM, when comparing the offset distances D1, the offset distances D1 of light at the same light-exiting angle may be compared.

Figure 4:
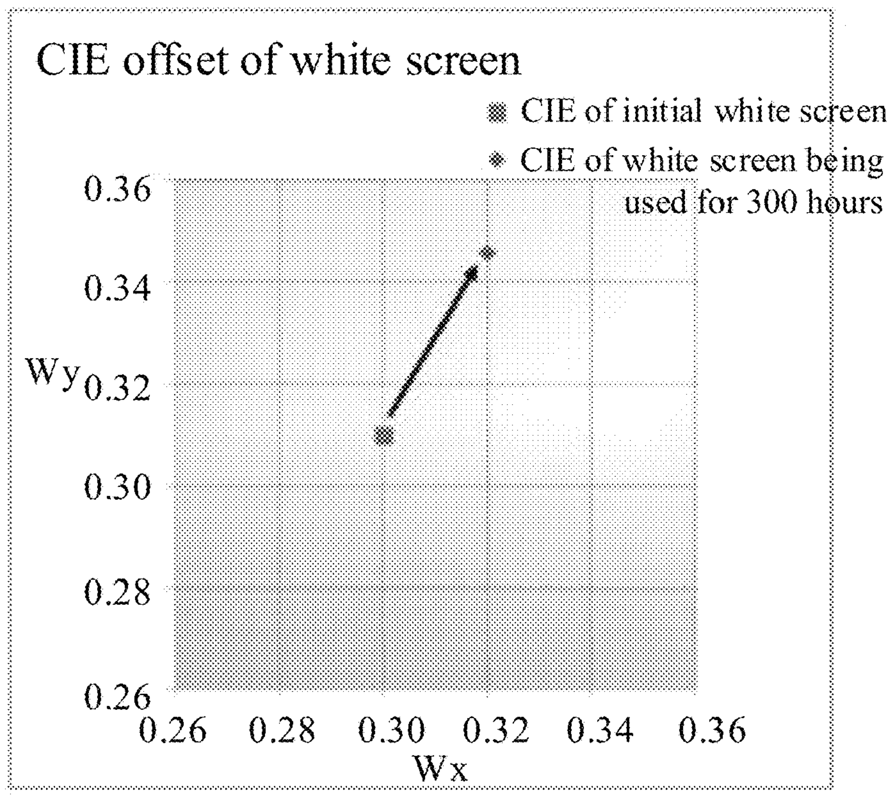
FIG. 4 is a diagram illustrating a CIE offset of white screen of an OLED display panel after being used for 300 hours.

FIG. 4 is a diagram illustrating a CIE offset of white screen of an OLED display panel after being used for 300 hours. As shown in FIG. 4, the display panel yellows seriously after use for 300 hours, and relative to an initial state, may have a color difference of greater than 5 JNCD.

In the display panel, the sub-pixels 100 may include a red sub-pixel (R), a green sub-pixel (G), and a blue sub-pixel (B). The blue sub-pixel has a short lifetime. If the sub-pixels R/G/B have the pixel openings of the same size, the display panel will undergo a serious yellowing phenomenon after use for a period of time. To improve this phenomenon, it is generally designed in the industry that the blue sub-pixel (B) has a maximum aperture opening ratio. The embodiment of the present disclosure is illustrated by taking as an example that the first sub-pixel 101 is the red sub-pixel (R), the second sub-pixel 102 is the green sub-pixel (G), and the third sub-pixel 103 is the blue sub-pixel (B). However, it needs to be noted that the embodiments of the present disclosure include but are not limited thereto, and the light-emitting colors of the sub-pixels may be determined as needed.

For the display panel integrated with the COE structure, there is a small size difference between the sub-pixels, which is conducive to improving the optical properties at viewing angles. Increasing the size of the blue sub-pixel, which is conducive to avoiding that the white screen yellows after operation for a period of time. That is, the solution of improving the optical properties at viewing angles is contrary to the design principle of avoiding that the white screen yellows after the product operates for a period of time.

Figure 5:
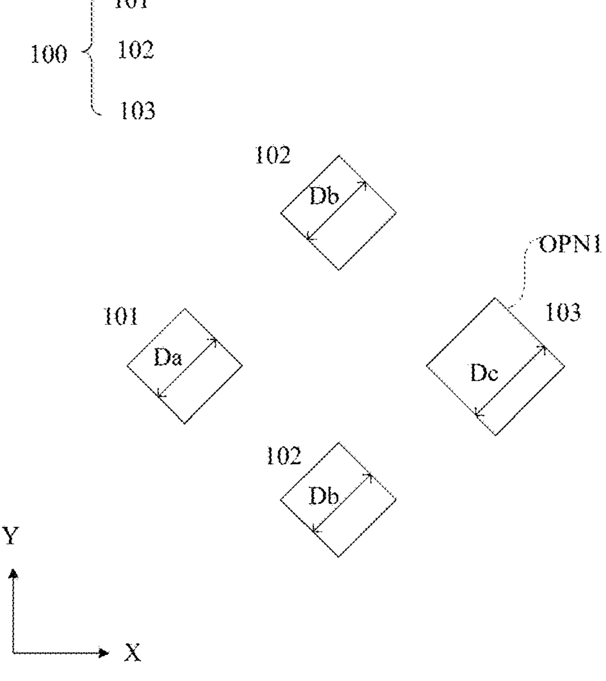
FIG. 5 is a schematic diagram of a display panel provided by an embodiment of the present disclosure.
Figure 6A:
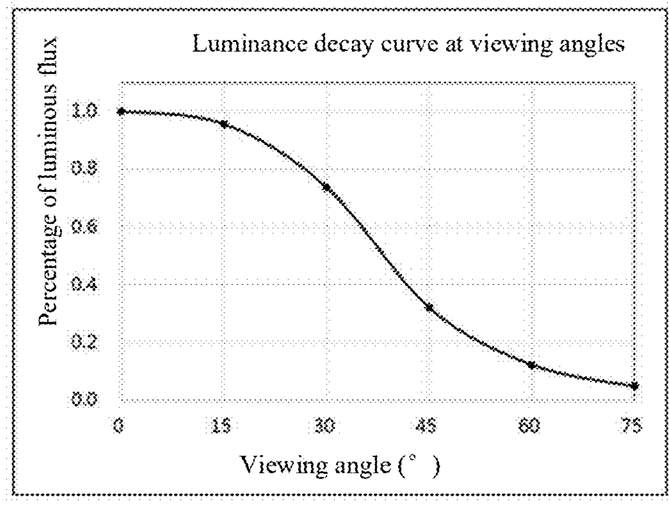
FIG. 6A illustrates a luminance decay curve at viewing angles for the display panel shown in FIG. 5.
Figure 6B:
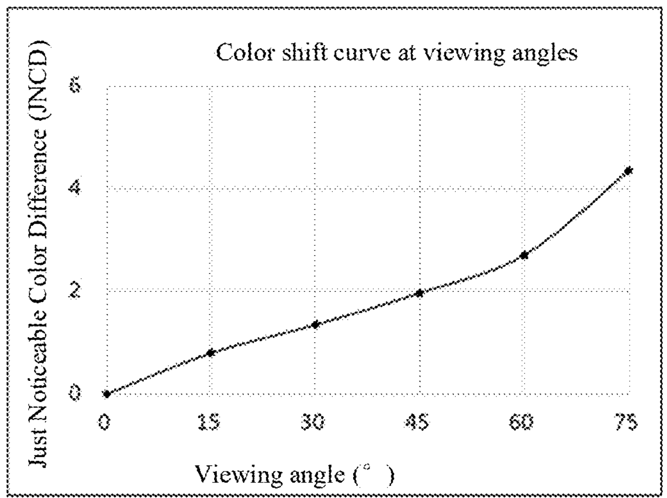
FIG. 6B illustrates a color shift curve at viewing angles for the display panel shown in FIG. 5.
Figure 6C:
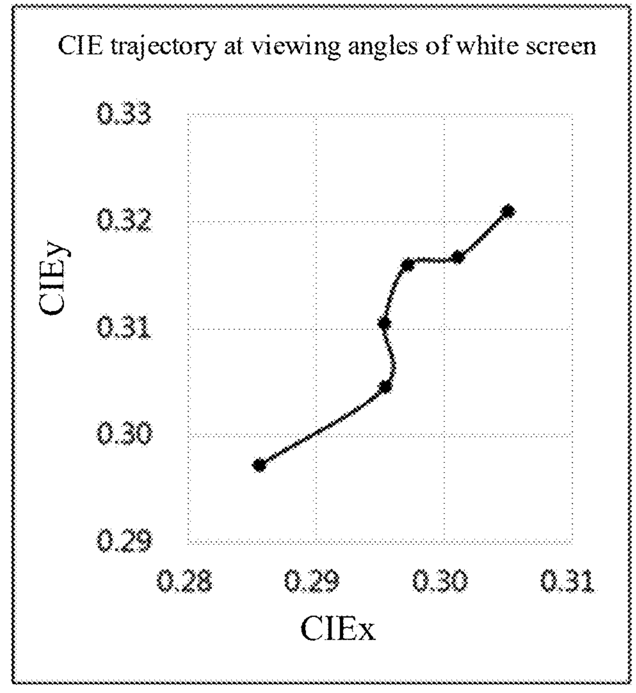
FIG. 6C illustrates a CIE trajectory at viewing angles of white screen for the display panel shown in FIG. 5.
Figure 6D:
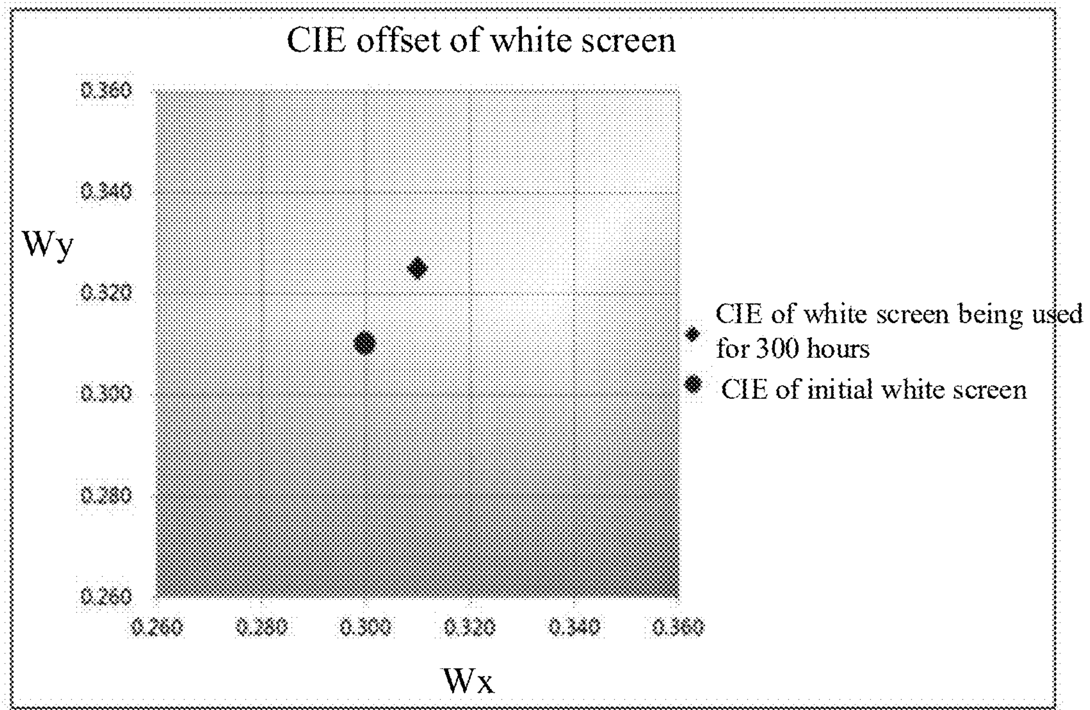
FIG. 6D illustrates a CIE offset of white screen of the display panel shown in FIG. 5.

FIG. 5 is a schematic diagram of a display panel provided by an embodiment of the present disclosure. FIG. 6A illustrates a luminance decay curve at viewing angles for the display panel shown in FIG. 5. FIG. 6B illustrates a color shift curve at viewing angles for the display panel shown in FIG. 5. FIG. 6C illustrates a CIE trajectory at viewing angles of white screen for the display panel shown in FIG. 5. FIG. 6D illustrates a CIE offset of white screen of the display panel shown in FIG. 5.

Figure 7:
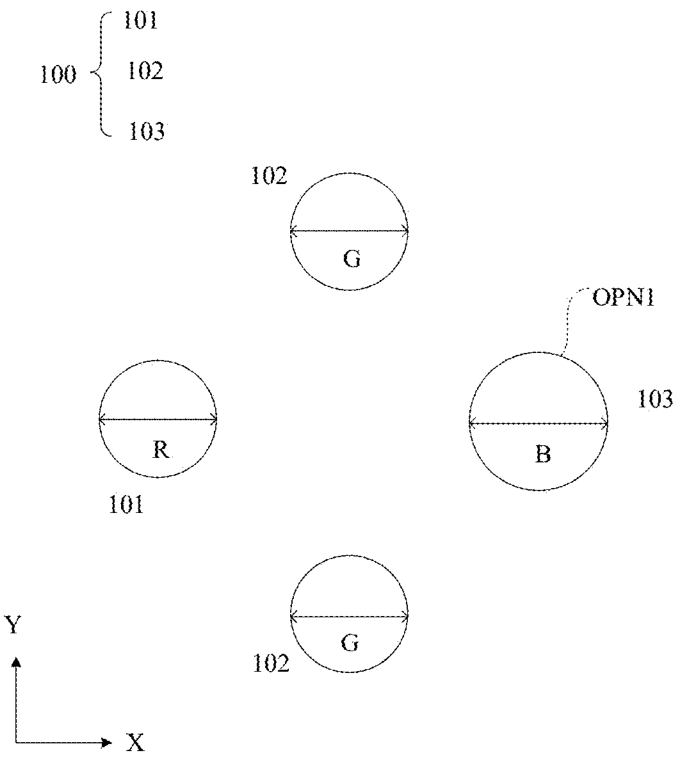
FIG. 7 is a schematic diagram of a display panel provided by an embodiment of the present disclosure.
Figure 8A:
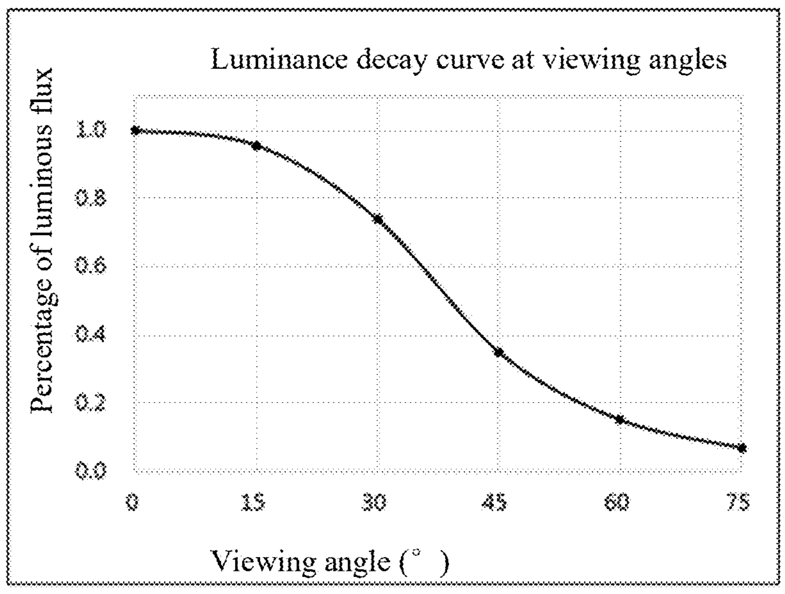
FIG. 8A illustrates a luminance decay curve at viewing angles for the display panel shown in FIG. 7.
Figure 8B:
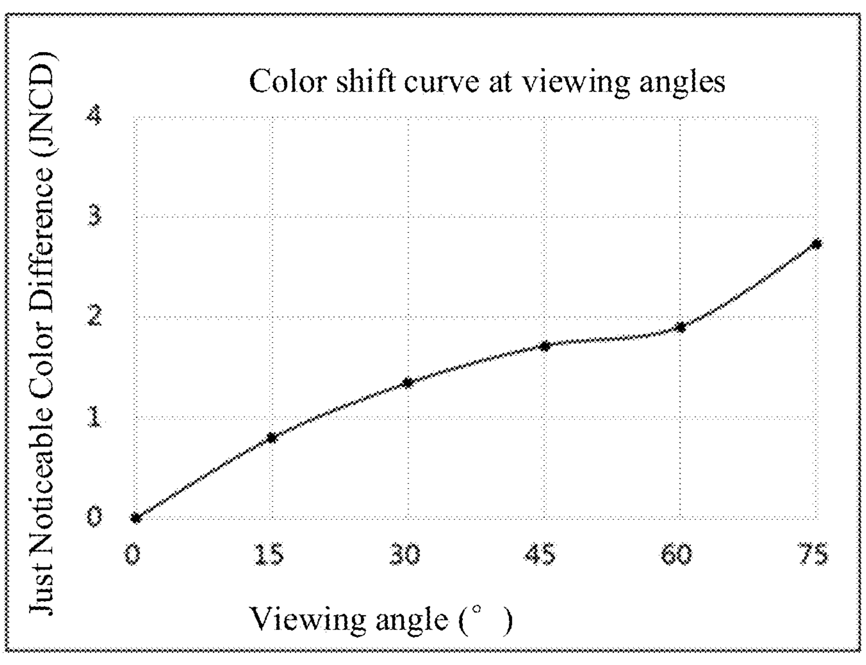
FIG. 8B illustrates a color shift curve at viewing angles for the display panel shown in FIG. 7.
Figure 8C:
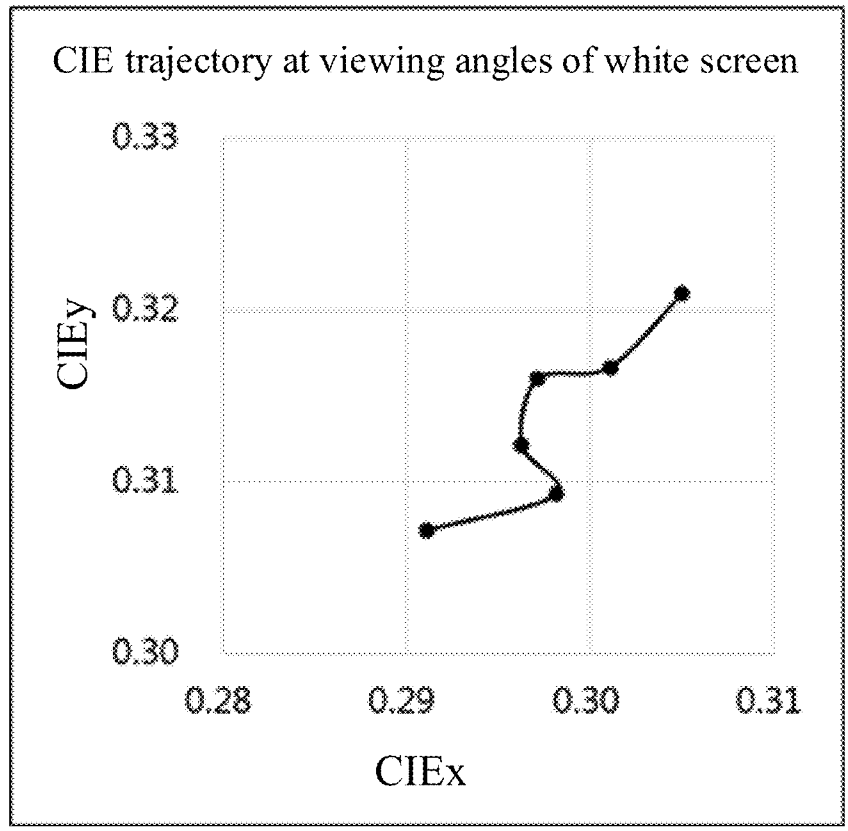
FIG. 8C illustrates a CIE trajectory at viewing angles of white screen for the display panel shown in FIG. 7.
Figure 8D:
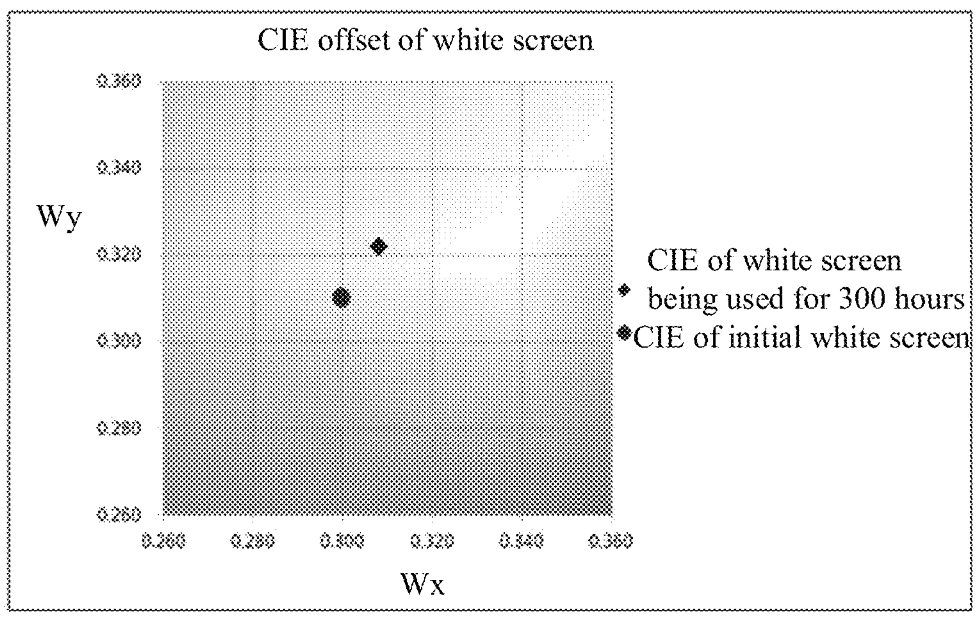
FIG. 8D illustrates a CIE offset of white screen of the display panel shown in FIG. 7.

FIG. 7 is a schematic diagram of a display panel provided by an embodiment of the present disclosure. FIG. 8A illustrates a luminance decay curve at viewing angles for the display panel shown in FIG. 7. FIG. 8B illustrates a color shift curve at viewing angles for the display panel shown in FIG. 7. FIG. 8C illustrates a CIE trajectory at viewing angles of white screen for the display panel shown in FIG. 7. FIG. 8D illustrates a CIE offset of white screen of the display panel shown in FIG. 7.

Figure 9:
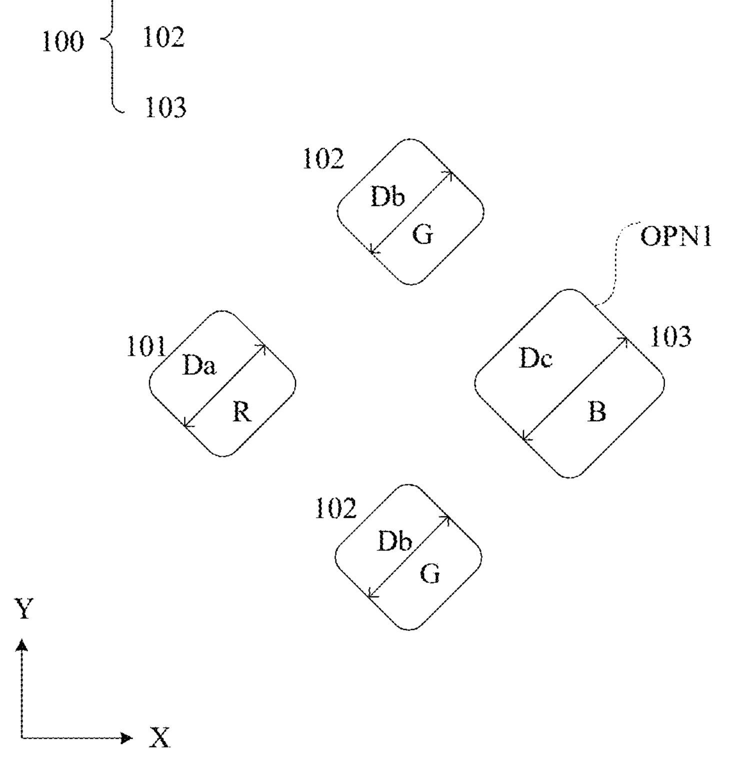
FIG. 9 is a schematic diagram of a display panel provided by an embodiment of the present disclosure.
Figure 10A:
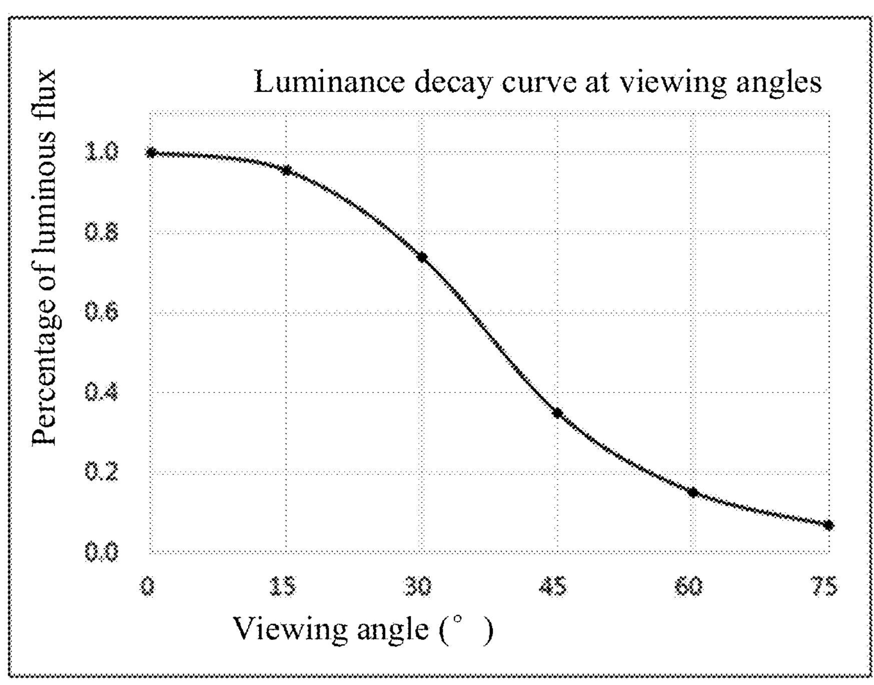
FIG. 10A illustrates a luminance decay curve at viewing angles for the display panel shown in FIG. 9.
Figure 10B:
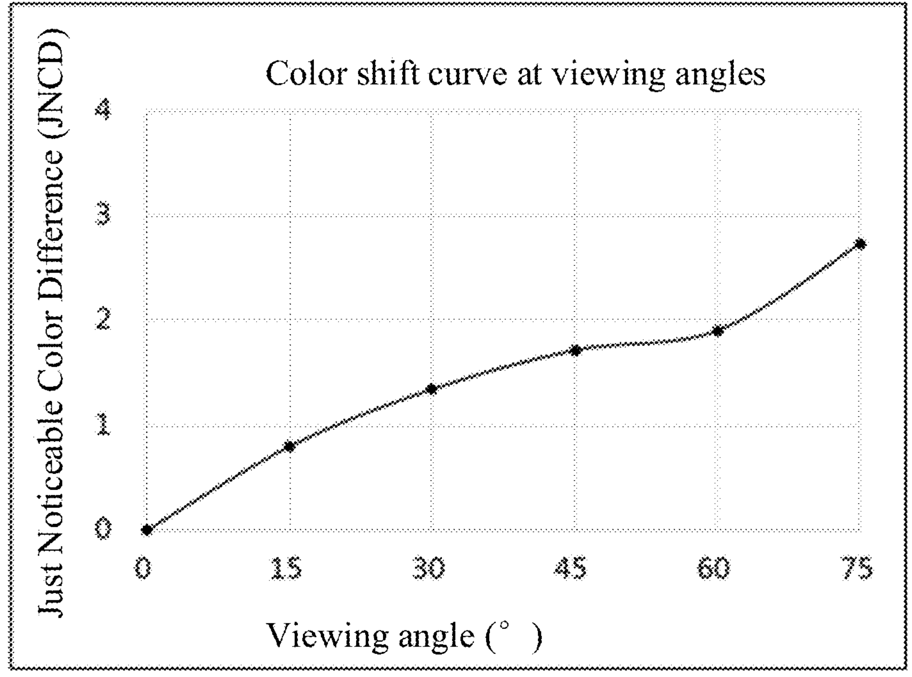
FIG. 10B illustrates a color shift curve at viewing angles for the display panel shown in FIG. 9.
Figure 10C:
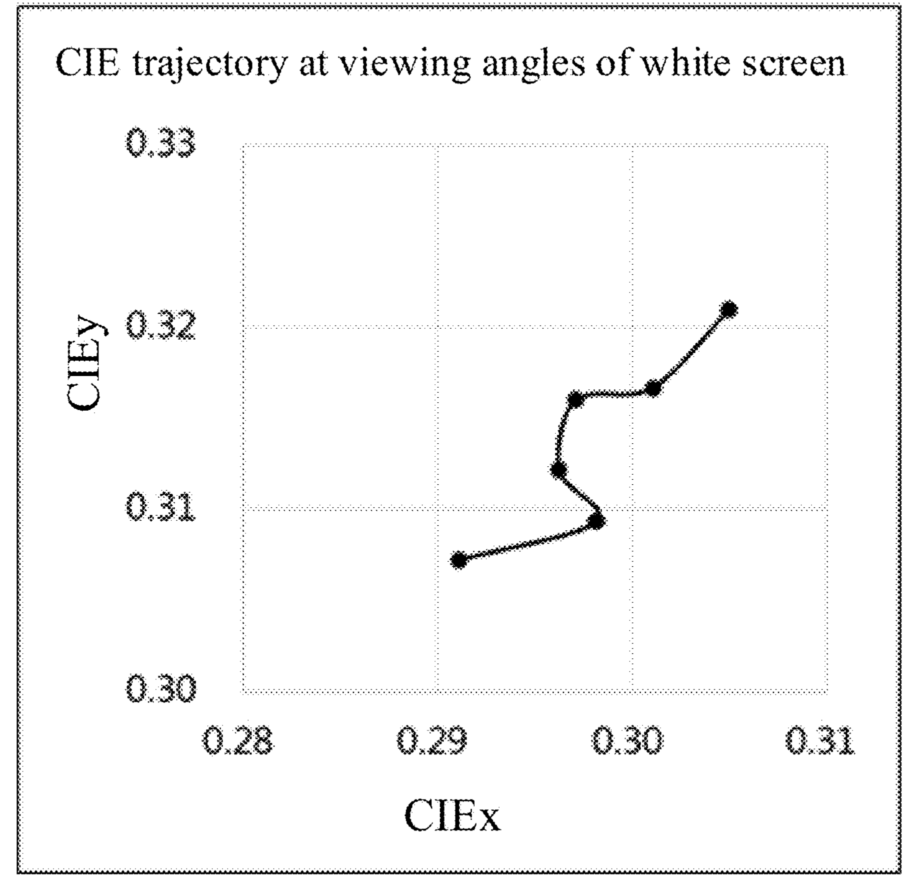
FIG. 10C illustrates a CIE trajectory at viewing angles of white screen for the display panel shown in FIG. 9.
Figure 10D:
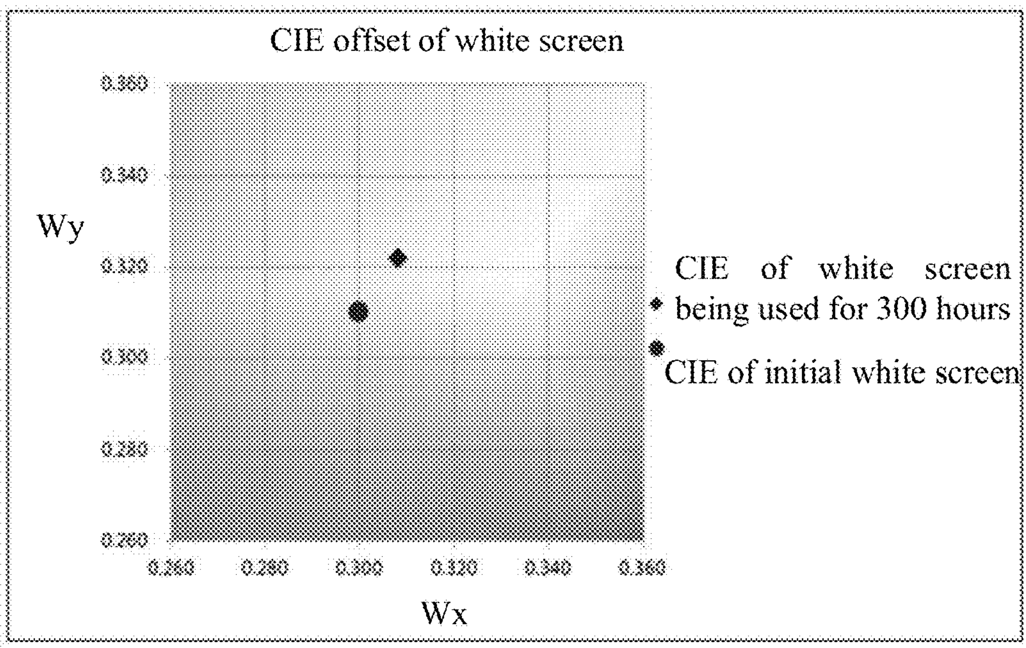
FIG. 10D illustrates a CIE offset of white screen of the display panel shown in FIG. 9.

FIG. 9 is a schematic diagram of a display panel provided by an embodiment of the present disclosure. FIG. 10A illustrates a luminance decay curve at viewing angles for the display panel shown in FIG. 9. FIG. 10B illustrates a color shift curve at viewing angles for the display panel shown in FIG. 9. FIG. 10C illustrates a CIE trajectory at viewing angles of white screen for the display panel shown in FIG. 9. FIG. 10D illustrates a CIE offset of white screen of the display panel shown in FIG. 9.

Figure 11:
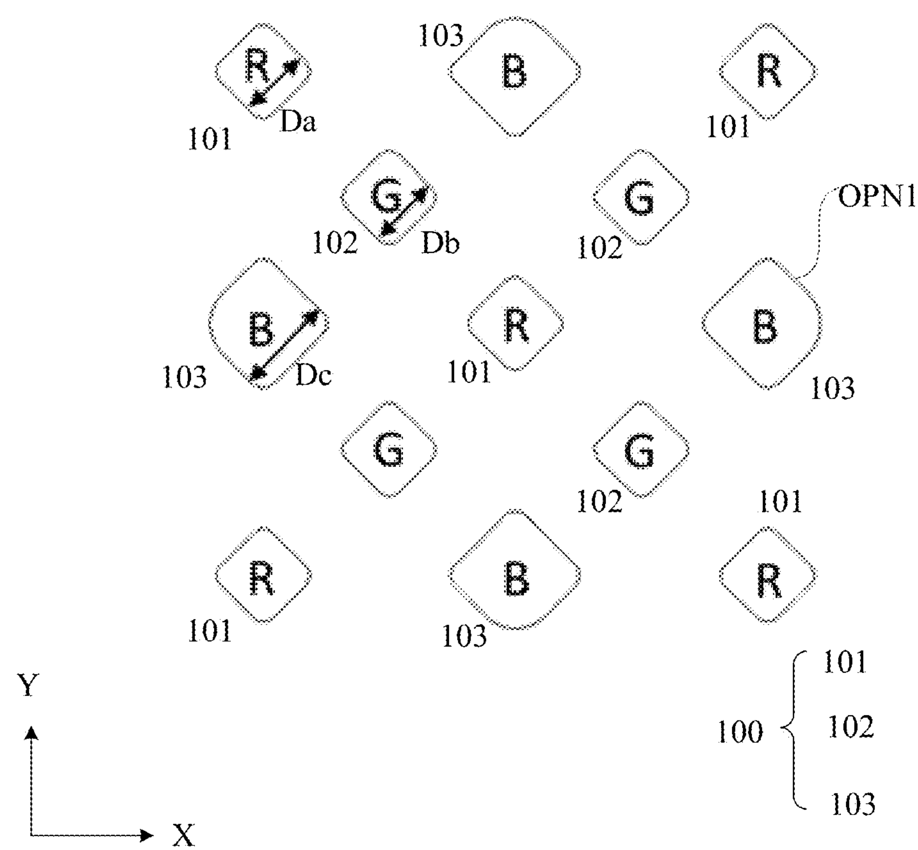
FIG. 11 is a schematic diagram of a display panel provided by an embodiment of the present disclosure.
Figure 12A:
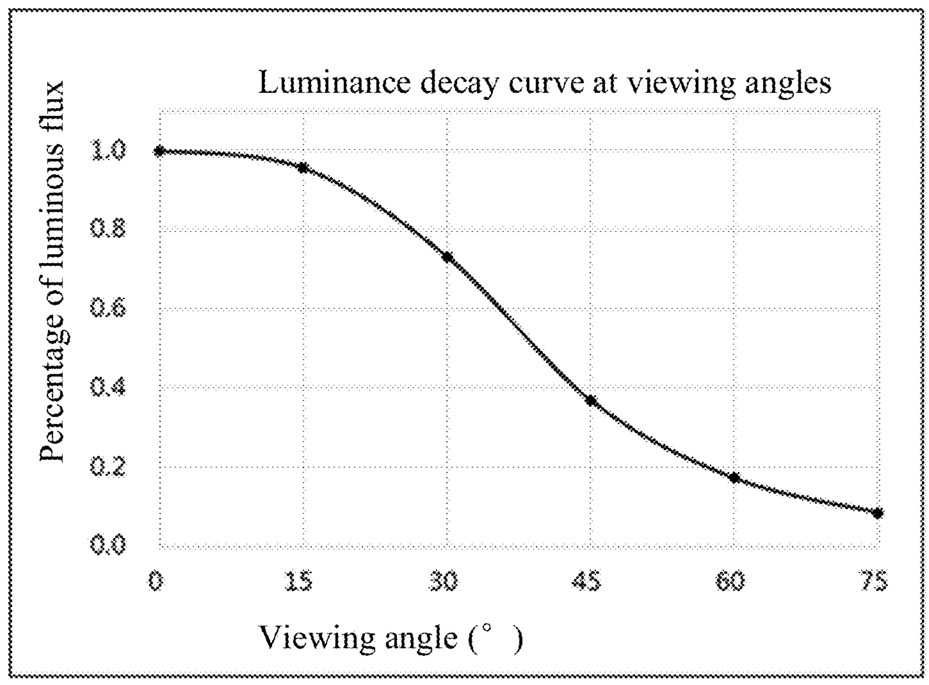
FIG. 12A illustrates a luminance decay curve at viewing angles for the display panel shown in FIG. 11.
Figure 12B:
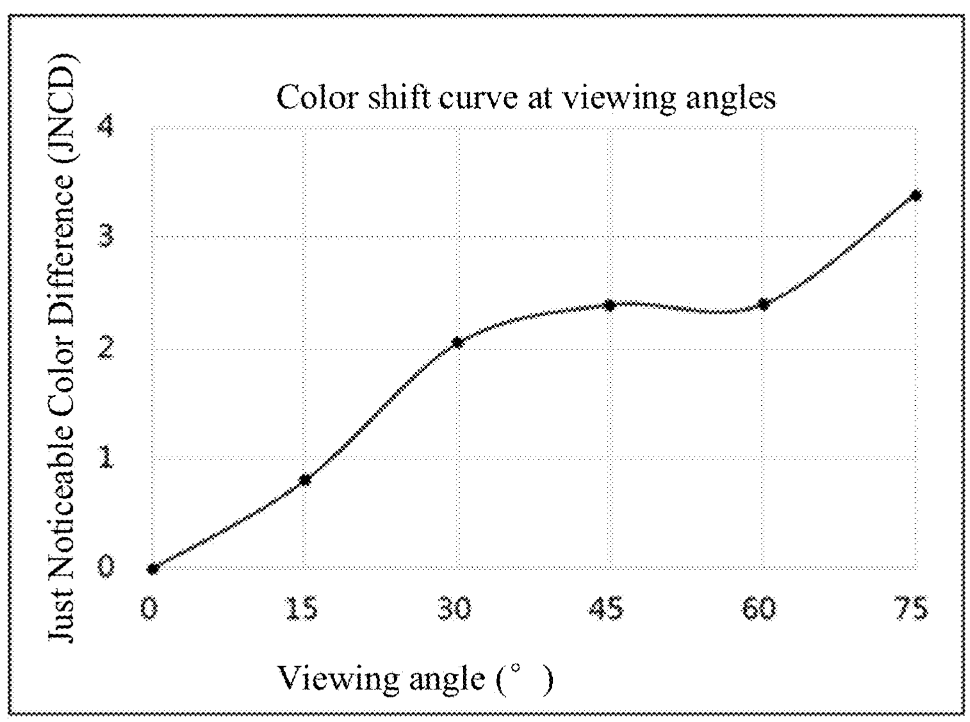
FIG. 12B illustrates a color shift curve at viewing angles for the display panel shown in FIG. 11.
Figure 12C:
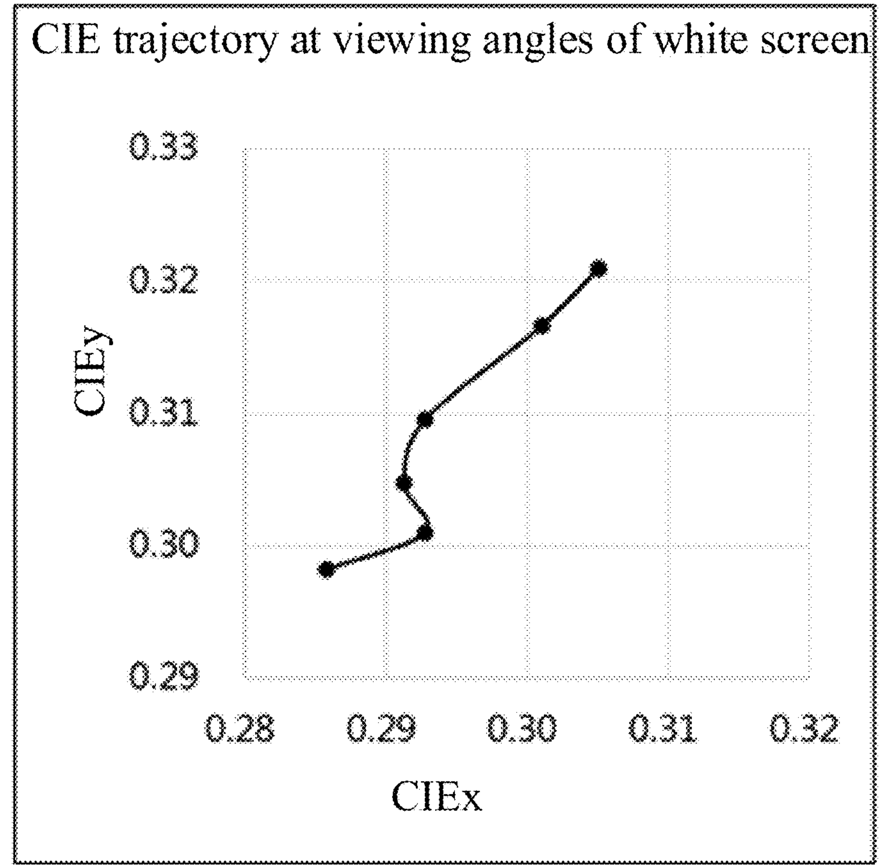
FIG. 12C illustrates a CIE trajectory at viewing angles of white screen for the display panel shown in FIG. 11.
Figure 12D:
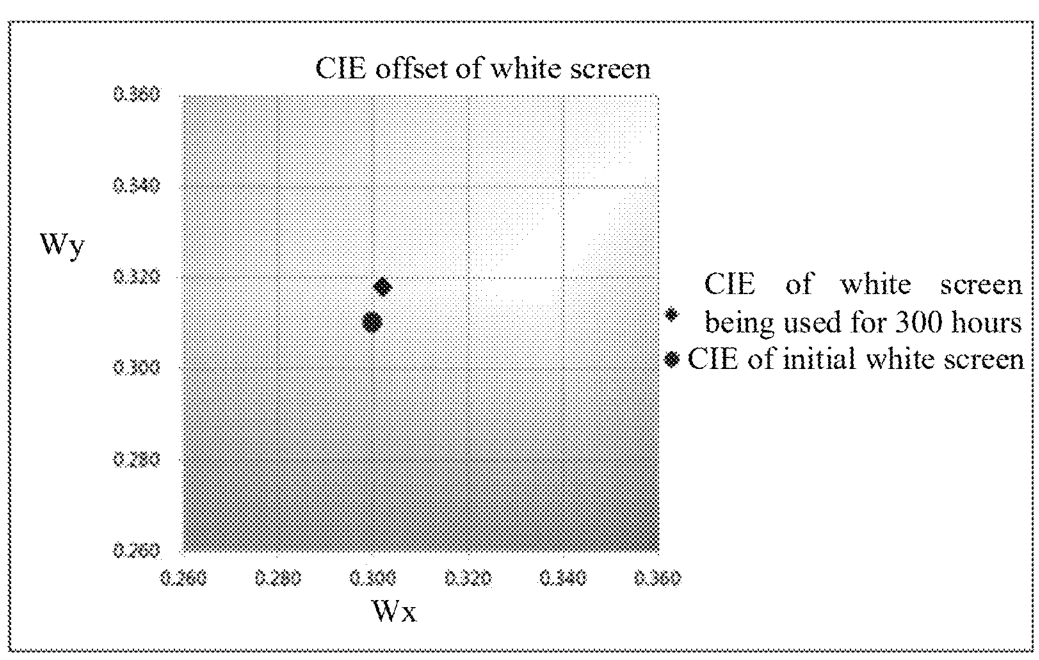
FIG. 12D illustrates a CIE offset of white screen of the display panel shown in FIG. 11.

FIG. 11 is a schematic diagram of a display panel provided by an embodiment of the present disclosure. FIG. 12A illustrates a luminance decay curve at viewing angles for the display panel shown in FIG. 11. FIG. 12B illustrates a color shift curve at viewing angles for the display panel shown in FIG. 11. FIG. 12C illustrates a CIE trajectory at viewing angles of white screen for the display panel shown in FIG. 11. FIG. 12D illustrates a CIE offset of white screen of the display panel shown in FIG. 11.

As shown in FIG. 2A to FIG. 2C, FIG. 4, FIG. 5, FIG. 7, FIG. 9, and FIG. 11, an embodiment of the present disclosure provides a display panel including a plurality of pixels PX located on a base substrate BS. Each pixel PX includes a plurality of sub-pixels 100, and each sub-pixel 100 has a pixel opening OPN1. The plurality of sub-pixels 100 include a first sub-pixel 101, a second sub-pixel 102, and a third sub-pixel 103. Among the first sub-pixel 101, the second sub-pixel 102, and the third sub-pixel 103, a size of the pixel opening OPN1 of a sub-pixel 100 having a maximum size is Dmax and a size of the pixel opening OPN1 of a sub-pixel 100 having a minimum size is Dmin, and the display panel meets: max/Dmin≤y, y=0.02*Dmin+0.85, where y is a coefficient.

In the display panel provided by the embodiment of the present disclosure, matching is performed on a size ratio for sizes of different sub-pixels, thereby improving the optical properties at viewing angles and the chromaticity lifetime of the display panel.

The display panel provided by the embodiment of the present disclosure may effectively improve the problem of degradation of the properties at viewing angles of the display panel, and the display panel with good optical properties at viewing angles can be obtained.

For example, the smaller the size of the smallest sub-pixel, the closer the value of Dmax/Dmin to 1. Thus, a difference in luminance decay (L-decay) caused by the size of the sub-pixel can be changed. For the display panel meeting the condition $Dmax/Dmin \leq y$, $y=0.02*Dmin+0.85$, i.e., the display panel designed with such sizes of the sub-pixels, the white light has a color shift to blue, producing a good visual effect. A luminance decay at 30° viewing angle is less than or equal to 26%, and a color difference of a white screen is less than 2.5 JNCD after operation for 300 hours.

For example, as shown in FIG. 5, FIG. 7, FIG. 9, and FIG. 11, the size of the pixel opening OPN1 of the first sub-pixel 101 is Da, the size of the pixel opening OPN1 of the second sub-pixel 102 is Db, and the size of the pixel opening OPN1 of the third sub-pixel 103 is Dc. The display panels shown in FIG. 5, FIG. 7, FIG. 9, and FIG. 11 may be a display panel integrated with the COE structure, and the structure thereof is as shown in FIG. 3, but is not limited thereto.

As shown in FIG. 5, in the display panel, the pixel structure is of a pentile arrangement. In the pixel structure, the size of the pixel opening OPN1 of the first sub-pixel 101 is the smallest, the size of the pixel opening OPN1 of the second sub-pixel 102 is greater than that of the first sub-pixel 101, and the size of the pixel opening OPN1 of the third sub-pixel 103 is greater than the size of the pixel opening OPN1 of the second sub-pixel 102, $Da \leq Db \leq Dc$. For example, in some embodiments, $Da=10$ μm, 10 μm$\leq Dc \leq$11.5 μm (the values are provided here to indicate a size relationship). According to a relation formula of an extent to which a placement size of a sub-pixel influences a luminance decay (L-decay), it is required that a sub-pixel of a single color has as many symmetry axes as possible or a periodic pattern composed of sub-pixels of the same color has as many symmetry axes as possible such that color shifts in different directions are consistent. A shape of the sub-pixels in the display panel shown in FIG. 5 is a square, but is not limited to square.

The optical properties at viewing angles that the display panel integrated with the COE structure shown in FIG. 5 can achieve are as shown in FIG. 6A to FIG. 6C.

FIG. 6A illustrates a white screen luminance decay curve at viewing angles for the display panel integrated with the COE structure, and the luminance decay at the 30° viewing angle is 26%, which is level with the display panel of the POL structure.

FIG. 6B illustrates a white screen color shift curve at viewing angles for the display panel integrated with the COE structure. The value of the color shift increases with the increase of viewing angle, and the value of the color shift at 75° viewing angle is less than 5 JNCD. FIG. 6C is a white screen CIE trajectory curve at viewing angles for the display panel integrated with the COE structure, and the color of the white screen at viewing angles is slightly blue. In this design, the display panel integrated with the COE structure has good properties at viewing angles.

In the display panel of the pixel structure shown in FIG. 5, because the size of the third sub-pixel 103 (the blue sub-pixel, B) decreases, the aperture opening ratio of the third sub-pixel 103 (B) is reduced. After operation for a period of time, screen yellowing will become worse. Therefore, the transmittance of the color filter layer CF of the third sub-pixel 103 (B) may be improved, without limitation thereto. For example, improving the transmittance of the color filter layer CF may be implemented by at least one of adjusting a film layer material and reducing a thickness. For example, adjusting a film layer material includes adding an additive thereto. Color filters different in transmittance and different in color may be manufactured by adding different additives. For example, the additives include, but are not limited to, a small molecular dye. The CIE offset of white screen of the display panel provided by the embodiment of the present disclosure after use for 300 hours is as shown in FIG. 6D. After operation for 300 hours, the white screen of the display panel yellows as compared with an initial value with a color difference of less than 2.5 JNCD. Compared with the design of the sub-pixels R/G/B having the pixel openings of the same size, the degree of yellowing is significantly alleviated.

In the display panel shown in FIG. 7, the pixel structure is of the pentile arrangement. In the pixel structure, the size of the pixel opening of the first sub-pixel 101 (the red sub-pixel, R) is the smallest; $Da \leq Db \leq Dc$, $Da=15$ μm, and 15 μm$\leq Dc \leq$17.25 μm (the values are provided here to indicate a relationship). A shape of the pixel openings of the sub-pixels in the display panel shown in FIG. 7 is a circle, but is not limited to circle.

In the display panel shown in FIG. 7, the optical properties at viewing angles that the display panel integrated with the COE structure can achieve are as shown in FIG. 8A to FIG. 8C. FIG. 8A illustrates a white screen luminance decay curve at viewing angles for the display panel integrated with the COE structure, and the luminance decay at the 30° viewing angle is less than or equal to 26%. FIG. 8B illustrates a white screen color shift curve at viewing angles for the display panel integrated with the COE structure. The value of the color shift increases with the increase of viewing angle, and the value of the color shift at the 75° viewing angle is less than 3 JNCD. FIG. 8C is a white screen CIE trajectory curve at viewing angles for the display panel integrated with the COE structure, and the color of the white screen at a viewing angle is slightly blue. In this design, the display panel integrated with the COE structure has good properties at viewing angles.

In an embodiment of the present disclosure, CIEx and CIEy refer to color coordinates, with CIEx referring to an x-coordinate and CIEy referring to a y-coordinate. For example, in CIE 1931 color space, the coordinates of white light are about (0.3,0.3).

In an embodiment of the present disclosure, Wx refers to coordinate CIEx of white light and Wy refers to coordinate CIEy of white light.

The CIE offset of white screen of the display panel shown in FIG. 7 after use for 300 hours is as shown in FIG. 8D. Compared with an initial value, the white screen of the display panel may have a color difference of less than 2 JNCD after operation for 300 hours.

For example, it is known that a color difference may be obtained by substituting two coordinates into a formula. For example, a calculation method for a color difference is as follows: the 1931 coordinate system is firstly transformed to the 1976 coordinate system, and a standard deviation of two coordinates is ascertained and finally divided by 0.004 to obtain a color shift degree (JNCD).

For example, transforming the 1931 coordinate system to the 1976 coordinate system may be performed by using a usual method.

Given the coordinate CIEx of white light is Wx and the coordinate CIEy of white light is Wy in the 1931 coordinate system and two coordinates of the 1976 coordinate system are coordinates u' and v', respectively, u'=4*Wx/(−2*Wx+12*Wy+3), v'=9*Wy/(−2*Wx+12*Wy+3), and JNCD=$[(u_2'-u_1')^2+(v_2'-v_1')^2]^{1/2}/0.004$. A CIE trajectory at viewing angles of white screen for the display panel shown in FIG. 7 is as shown in FIG. 8C, and the color differences of the display panel at different viewing angles are as shown in Table 1. JNCD is obtained by calculating based on coordinates at the 0° viewing angle.

TABLE 1

Color Differences of Display Panel Shown in FIG. 7 at Different Viewing Angles

| Viewing Angle θa (°) | Wx | Wy | u' | v' | JNCD |
|---|---|---|---|---|---|
| 0 | 0.305 | 0.321 | 0.195 | 0.463 | 0.0 |
| 15 | 0.301 | 0.317 | 0.194 | 0.460 | 0.8 |
| 30 | 0.297 | 0.316 | 0.192 | 0.459 | 1.4 |
| 45 | 0.296 | 0.312 | 0.192 | 0.456 | 1.8 |
| 60 | 0.299 | 0.309 | 0.196 | 0.455 | 1.9 |
| 75 | 0.291 | 0.307 | 0.191 | 0.453 | 2.8 |

As shown in Table 1, the color difference of the white screen of the display panel shown in FIG. 7 at viewing angles of 0° to 60° is less than 2 JNCD.

In the display panel shown in FIG. 9, the pixel structure is of the pentile arrangement. In the pixel structure, the size of the pixel opening of the first sub-pixel 101 (the red sub-pixel, R) is the smallest; Da≤Db≤Dc, Da=20 μm, and 20 μm≤Db≤25 μm (the values are provided here to indicate a relationship). In the display panel shown in FIG. 9, a shape of the pixel openings of the sub-pixels is a rounded square, but is not limited to rounded square.

In the display panel shown in FIG. 9, the optical properties at viewing angles that the display panel integrated with the COE structure can achieve are as shown in FIG. 10A to FIG. 10C. FIG. 10A illustrates a white screen luminance decay curve at viewing angles for the display panel integrated with the COE structure, and the luminance decay at the 30° viewing angle is less than or equal to 26%. FIG. 10B illustrates a white screen color shift curve at viewing angles for the display panel integrated with the COE structure. The value of the color shift increases with the increase of viewing angle, and the value of the color shift at the 75° viewing angle is less than 5 JNCD. FIG. 10C is a white screen CIE trajectory curve at viewing angles for the display panel integrated with the COE structure, and the color of the white screen at a viewing angle is slightly blue to a slightly increased extent as compared with the display panel shown in FIG. 7. In this design, the display panel integrated with the COE structure has good properties at viewing angles.

The CIE offset of white screen of the display panel shown in FIG. 9 after use for 300 hours is as shown in FIG. 10D. Compared with an initial value, the white screen of the display panel has a color difference of less than 1.5 JNCD after operation for 300 hours.

In the display panel shown in FIG. 11, the pixel structure is of the pentile arrangement. In the pixel structure, the size of the pixel opening of the first sub-pixel 101 (the red sub-pixel R) is the smallest, and Da≤Db≤Dc. For example, Da=25 μm, and 25 μm≤Dc≤33.75 μm (the values are provided here to indicate a relationship).

In the display panel shown in FIG. 11, the optical properties at viewing angles that the display panel integrated with the COE structure can achieve are as shown in FIG. 12A to FIG. 12C. FIG. 12A illustrates a white screen luminance decay curve at viewing angles for the display panel integrated with the COE structure, and the luminance decay at the 30° viewing angle is less than or equal to 26%. FIG. 12B illustrates a white screen color shift curve at viewing angles for the display panel integrated with the COE structure. The value of the color shift increases with the increase of viewing angle, and the value of the color shift at the 75° viewing angle is less than 4 JNCD. FIG. 12C is a white screen CIE trajectory curve at viewing angles for the display panel integrated with the COE structure, and the color of the white screen at viewing angles is slightly blue. In this design, the display panel integrated with the COE structure has good properties at viewing angles.

The y-coordinates in FIG. 6A, FIG. 8A, FIG. 10A, and FIG. 12A refer to luminous flux percentages. For example, the luminance gradually decays with the increase of viewing angle. For example, when the luminance at the 0° viewing angle is 500 nit and the luminance at the 30° viewing angle is 400 nit, the luminance at the 30° viewing angle is 80%.

In an embodiment of the present disclosure, the color of the white screen at a viewing angle being slightly blue refers to that at the same point, when a viewing angle increases, the screen gradually turns blue.

FIG. 6C, FIG. 8C, FIG. 10C, and FIG. 12C illustrate CIE coordinates at 0°, 15°, 30°, 45°, 60°, and 75° viewing angles. In FIG. 6C, FIG. 8C, FIG. 10C, and FIG. 12C, the CIE coordinates at 0°, 15°, 30°, 45°, 60°, and 75° viewing angles are orderly illustrated from the top down.

The CIE offset of white screen of the display panel shown in FIG. 11 after use for 300 hours is as shown in FIG. 12D. Compared with an initial value, the white screen of the display panel has a color difference of less than 1 JNCD after operation for 300 hours.

In the display panels shown in FIG. 5, FIG. 7, FIG. 9, and FIG. 11, the size of the pixel opening of the first sub-pixel is the smallest. Likewise, it may be adjusted such that the second sub-pixel 102 (the green sub-pixel, G) is the sub-pixel of which the size of the pixel opening is the smallest.

In the display panels shown in FIG. 5, FIG. 7, FIG. 9, and FIG. 11, the description is made by taking the pentile arrangement as an example. Likewise, the pixel structure may also be adjusted to a real RGB pixel arrangement.

In the display panel integrated with the COE structure, a relation formula of an extent to which the black matrix influences a luminance decay (L-decay) for sub-pixels of different colors is as follows:

$$\alpha_j = \frac{A - D2_j}{Dj}.$$

This may also be applied to a vehicle-mounted product to implement applications in different scenarios. The description on the formula may be as presented above, which will not be redundantly repeated here.

For example, as shown in FIG. 5, FIG. 7, FIG. 9, and FIG. 11, in the display panels provided by the embodiments of the present disclosure, the size of the pixel opening OPN1 is a length, a diameter, or an area of the pixel opening OPN1. By defining the size D of the pixel opening OPN1 as the length, the diameter, or the area of the pixel opening OPN1, the parameters in the formula Dmax/Dmin≤0.02*Dmin+0.85 are further specified. It needs to be noted that in calculation, the units of the size used for Dmax are identical to the units of the size used for Dmin. That is, when Dmax is identified with the length or the diameter, Dmin is also identified with the length or the diameter. When Dmax is identified with the area, Dmin is also identified with the area.

For example, as shown in FIG. 5, FIG. 7, FIG. 9, and FIG. 11, in the display panels provided by the embodiments of the present disclosure, the shape of the pixel opening OPN1 includes a rectangle, a rounded rectangle, or a circle. As a matter of course, the pixel opening OPN1 in the display panels provided by the embodiments of the present disclosure may also be in other shapes.

For example, in the display panel provided by an embodiment of the present disclosure, the first sub-pixel 101, the second sub-pixel 102, and the third sub-pixel 103 are configured to emit light different in color. In the display panel provided by the embodiment of the present disclosure, matching is performed on a single-color sub-pixel size ratio for sizes of different sub-pixels, thereby improving the optical properties at viewing angles and the chromaticity lifetime of the display panel integrated with the COE structure. The display panel provided by the embodiment of the present disclosure is described by taking as an example that the first sub-pixel 101 emits red light, the second sub-pixel 102 emits green light, and the third sub-pixel 103 emits blue light.

For example, as shown in FIG. 2A to FIG. 2C, FIG. 4, FIG. 5, FIG. 7, FIG. 9, and FIG. 11, in the display panels provided by the embodiments of the present disclosure, the sub-pixel 100 includes a light-emitting element EM, and a size of the pixel opening OPN1 is D. The display panel further includes an encapsulation layer EPS, a black matrix BM, and a color filter layer CF. The encapsulation layer EPS is configured to encapsulate the light-emitting element EM. The black matrix BM and the color filter layer CF are located on the encapsulation layer EPS. The black matrix BM has an opening OPN2. An orthographic projection of the pixel opening OPN1 on the base substrate BS falls within an orthographic projection of the opening OPN2 of the black matrix BM on the base substrate BS, and a distance between the orthographic projection of the pixel opening OPN1 on the base substrate BS and the orthographic projection of the opening OPN2 of the black matrix BM on the base substrate BS is D2.

An embodiment of the present disclosure is illustrated by taking as an example that the orthographic projection of the pixel opening OPN1 on the base substrate BS completely falls within the orthographic projection of the opening OPN2 of the black matrix BM on the base substrate BS. As a matter of course, in other embodiments, the orthographic projection of the pixel opening OPN1 on the base substrate BS may not completely fall within the orthographic projection of the opening OPN2 of the black matrix BM on the base substrate BS as long as the orthographic projection of the pixel opening OPN1 on the base substrate BS overlaps the orthographic projection of the opening OPN2 of the black matrix BM on the base substrate BS and light can be emitted from the sub-pixel.

The display panel provided by the embodiment of the present disclosure may effectively improve the problem of degradation of the properties at viewing angles of the display panel due to the introduction of the COE structure, and the display panel with good optical properties at viewing angles can be obtained.

For example, as shown in FIG. 4, an offset distance of light emitted from the light-emitting element EM is D1, and the display panel meets:

$$\alpha = \frac{D1 - D2}{D},$$

where α refers to an extent to which the light emitted from the light-emitting element EM is influenced by the black matrix BM.

As can be seen from the above formula, the influence of the black matrix BM on the luminance of the display panel decreases as the size D of the pixel opening OPN1 increases, increases as the offset distance D1 increases, and decreases as the distance D2 increases. The influence of the black matrix BM on the display panel may be reduced by adjusting at least one of the size D of the pixel opening OPN1, the offset distance D1, and the distance D2.

In the same display panel, the sizes D of the pixel openings OPN1 of the sub-pixels of different colors may be different.

In the above formula, the size D of the pixel opening OPN1 may be determined by pixels per inch (PPI) that a product has. The distance D2 is a design value for the product. For example, the offset distance D1 is related to thicknesses of respective film layers between the light-emitting element and the color filter layer and refractive indexes of respective film layers.

For example, for a mobile phone product, the distance D2 is usually designed to, but not limited to, be 4-6 μm. The distance D2 may vary with different products.

For example, in the display panel provided by an embodiment of the present disclosure, the display panel meets: $L_{\varphi 1}=(1-\alpha)*L_{\varphi 0}$, where $L_{\varphi 1}$ refers to a luminance of the display panel; $L_{\varphi 0}$ refers to a luminance of a structure obtained by removing the black matrix BM and the color filter layer CF from the display panel; and α refers to an extent to which the light emitted from the light-emitting element EM is influenced by the black matrix BM. α can be obtained by the above formula. That is, the luminance of the display panel integrated with the COE structure may be obtained by substituting α obtained by $$\alpha = \frac{D1 - D2}{D}$$

into a luminance formula. The luminance $L_{\varphi 0}$ of the structure obtained by removing the black matrix BM and the color filter layer CF from the display panel may be obtained by premeasuring the structure obtained by removing the black matrix BM and the color filter layer CF. It needs to be noted that to obtain an accurate luminance value, the display panel integrated with the COE structure differs from the structure obtained by removing the black matrix BM and the color filter layer CF only in that the latter has no black matrix BM and no color filter layer CF.

For example, in the display panel provided by an embodiment of the present disclosure, $$D1 = \sum_{L1}^{Ln} d_i \tan\theta_i,$$

where L1 refers to a film layer closest to a light-exiting side of the light-emitting element EM; Ln refers to the color filter layer CF; $d_i$ refers to a thickness of the $i^{th}$ film layer between the film layer L1 and the color filter layer Ln; $\theta_i$ refers to a refraction angle of light incident on the $i^{th}$ film layer; 1<i<n, and n>i; i is a positive integer greater than 1, and n is a positive integer greater than 2. As shown in FIG. 3, for example, the offset distance D1 is a horizontal offset distance, i.e., an offset distance in the horizontal direction, or an offset distance in direction X. For example, the offset distance D1 is controlled by parameters such as the refractive index and the thickness of a film layer through which light passes. The greater the offset distance D1, the easier the light being blocked by the black matrix. The offset distance D1 refers to a horizontal distance between a position where light is emitted and a position where the light reaches the color filter layer CF.

For example, in an embodiment of the present disclosure, the offset distance D1 is an offset distance of light emitted from the center of the light-emitting element EM. For example, the center of the light-emitting element EM refers to the geometric center of the light-emitting element EM. For example, the center of the light-emitting element EM refers to, but is not limited to, the center of gravity of the light-emitting element EM.

For example, as shown in FIG. 3, the offset distance D1 refers to a distance of an intersection point of light emitted from the center of the light-emitting element EM at a light-exiting angle of θ and a plane of an upper surface of the black matrix BM from the center of the light-emitting element EM.

Usually, the offset distance D1 may be an offset distance of light at any of light-exiting angles of 30° to 60°. As shown in FIG. 3, the offset distance D1 in the embodiment of the present disclosure is, as a matter of course, not limited to, an offset distance of light at the light-exiting angle of 30°.

For example, as shown in FIG. 3, the offset distance D1 refers to a distance of an intersection point of light emitted from the center of the light-emitting element EM at a light-exiting angle of θ and a plane of an upper surface of the black matrix BM from the center of the light-emitting element EM. For example, the offset distance D1 is smaller than half of the size of the opening OPN2 of the black matrix BM, but not limited thereto. As shown in FIG. 3, the film layer closest to the light-exiting side of the light-emitting element EM is the first encapsulation thin-film EPS1. As shown in FIG. 3, the film layers between the film layer L1 and the color filter layer CF include the second encapsulation thin-film EPS2, the third encapsulation thin-film EPS3, the insulating layer 801, the first touch layer TL1, the insulating layer 802, the second touch layer TL2, the insulating layer 803, and the black matrix BM. As a matter of course, the film layers between the film layer L1 and the color filter layer CF are not limited to those shown in FIG. 3 and may be determined as needed.

For example, in some display panels, for the first sub-pixel 101, the second sub-pixel 102, and the third sub-pixel 103, thicknesses d of respective film layers between the light-emitting elements of the sub-pixels (R/G/B) emitting light different in color are the same, and the refractive indexes n of the corresponding film layers are also the same. Therefore, it is believed that for the first sub-pixel 101, the second sub-pixel 102, and the third sub-pixel 103, the offset distance D1 is fixed and assumed as a constant A. An extent to which the COE structure influences different sub-pixels is expressed as $$\alpha_j = \frac{A - D2_j}{Dj}.$$

That is, the relation formula of the extent to which the black matrix influences a luminance decay (L-decay) is as follows:

$$\alpha_j = \frac{A - D2_j}{Dj},$$

where i refers to a sub-pixel of a different color; for example, j is R, G, or B.

If the extents to which the COE structure influences a luminance decay at a viewing angle for sub-pixels of different colors are identical or close, the luminance decay is consistent for the first sub-pixel 101 (i.e., the red sub-pixel (R)), the second sub-pixel 102 (i.e., the green sub-pixel (G)), and the third sub-pixel 103 (i.e., the green sub-pixel (B)), i.e., αR=αG=αB. Thus, the display panel with good optical properties at viewing angles can be obtained.

As a matter of course, in some other embodiments, for the first sub-pixel 101, the second sub-pixel 102, and the third sub-pixel 103, the thicknesses d of the respective corresponding film layers between the light-emitting elements of the sub-pixels (R/G/B) emitting light different in color may be different, but the refractive indexes n of the corresponding film layers are the same. Thus, the distance D1 may be adjusted by adjusting the thicknesses d of the film layers between the light-emitting element at each sub-pixel and the COE so that different sub-pixels may have different distances D1.

For example, in the display panel provided by an embodiment of the present disclosure, the sub-pixel 100 includes a light-emitting element EM, and a size of the pixel opening OPN1 is D. The display panel further includes an encapsulation layer EPS, a black matrix BM, and a color filter layer CF. The encapsulation layer EPS is configured to encapsulate the light-emitting element EM. The black matrix BM and the color filter layer CF are located on the encapsulation layer EPS. The black matrix BM has an opening. An orthographic projection of the pixel opening OPN1 on the base substrate BS falls within an orthographic projection of the opening of the black matrix BM on the base substrate BS, and a distance between the orthographic projection of the pixel opening OPN1 on the base substrate BS and the orthographic projection of the opening of the black matrix BM on the base substrate BS is D2. The values of at least two of the distance D2 of the first sub-pixel 101, the distance D2 of the second sub-pixel 102, and the distance D2 of the third sub-pixel 103 are different. That is, in the same display panel, different sub-pixels may have different distances D2.

Thus, in the display panel provided by the embodiment of the present disclosure, for the first sub-pixel 101, the second sub-pixel 102, and the third sub-pixel 103, different sub-pixels may have different sizes D of the pixel openings; different sub-pixels may have different offset distance D1; and different sub-pixels may have different distances D2. Thus, at least two of the first sub-pixel 101, the second sub-pixel 102, and the third sub-pixel 103 may have different sizes D of the pixel openings; at least two of the first sub-pixel 101, the second sub-pixel 102, and the third sub-pixel 103 may have different offset distance D1; and at least two of the first sub-pixel 101, the second sub-pixel 102, and the third sub-pixel 103 may have different distances D2.

For example, as shown in FIG. 6A, FIG. 8A, FIG. 10A, and FIG. 12A, in the display panels provided by the embodiments of the present disclosure, compared with the luminance at the 0° viewing angle, the luminance at the 30° viewing angle has a luminance decay of less than or equal to 26%.

For example, as shown in FIG. 6D, FIG. 8D, FIG. 10D, and FIG. 12D, in the display panels provided by the embodiments of the present disclosure, compared with initial operation, the color difference of the white screen is less than 2.5 JNCD after the display panel operates for 300 hours.

For example, as shown in FIG. 2A to FIG. 2C, in the display panel provided by the embodiment of the present disclosure, the light-emitting elements EM include the first light-emitting element EM, the second light-emitting element EM, and the third light-emitting element EM. The first light-emitting element EM includes the first light-emitting layer EML1 and the first color shift adjustment layer AL1; the second light-emitting element EM includes the second light-emitting layer EML2 and the second color shift adjustment layer AL; and the third light-emitting element EM includes the third light-emitting layer.

For example, as shown in FIG. 2A to FIG. 2C, in the display panel provided by the embodiment of the present disclosure, the thickness of the first color shift adjustment layer is in a range of 50-100 nm and the thickness of second color shift adjustment layer is in a range of 25-40 nm; the third light-emitting element EM further includes the third color shift adjustment layer AL3; and the thickness of the third color shift adjustment layer is greater than 0 and less than or equal to 15 nm. As a matter of course, the display panel may include no third color shift adjustment layer AL3.

Figure 13:
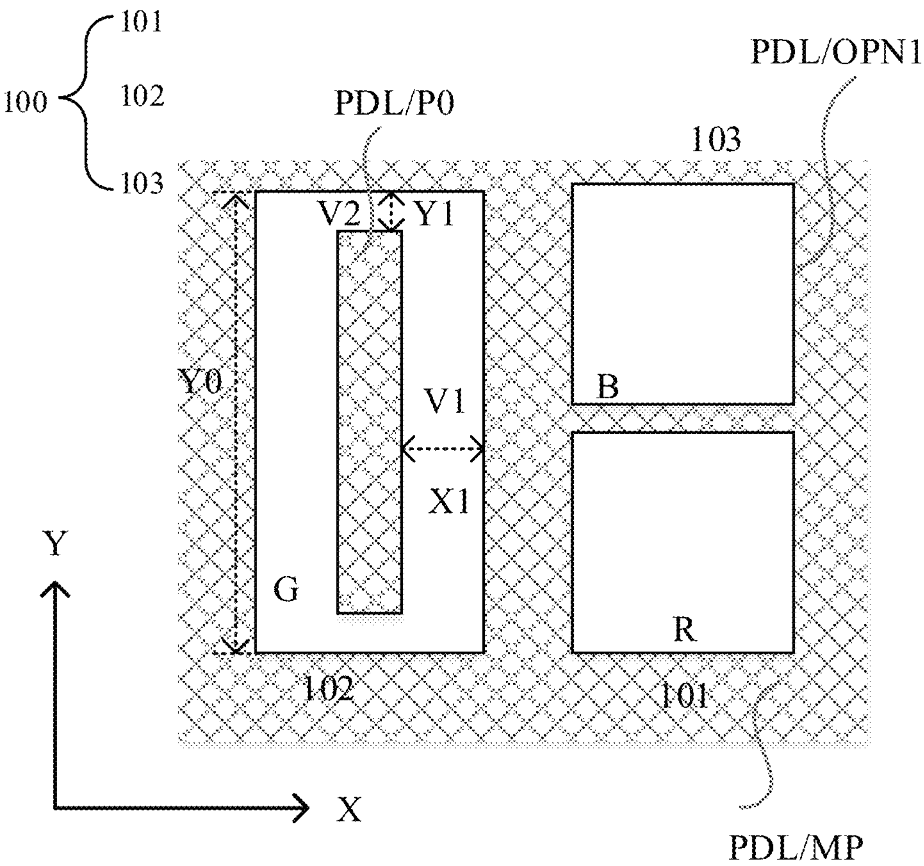
FIG. 13 is a top view of a pixel structure of a display panel provided by an embodiment of the present disclosure.
Figure 14:
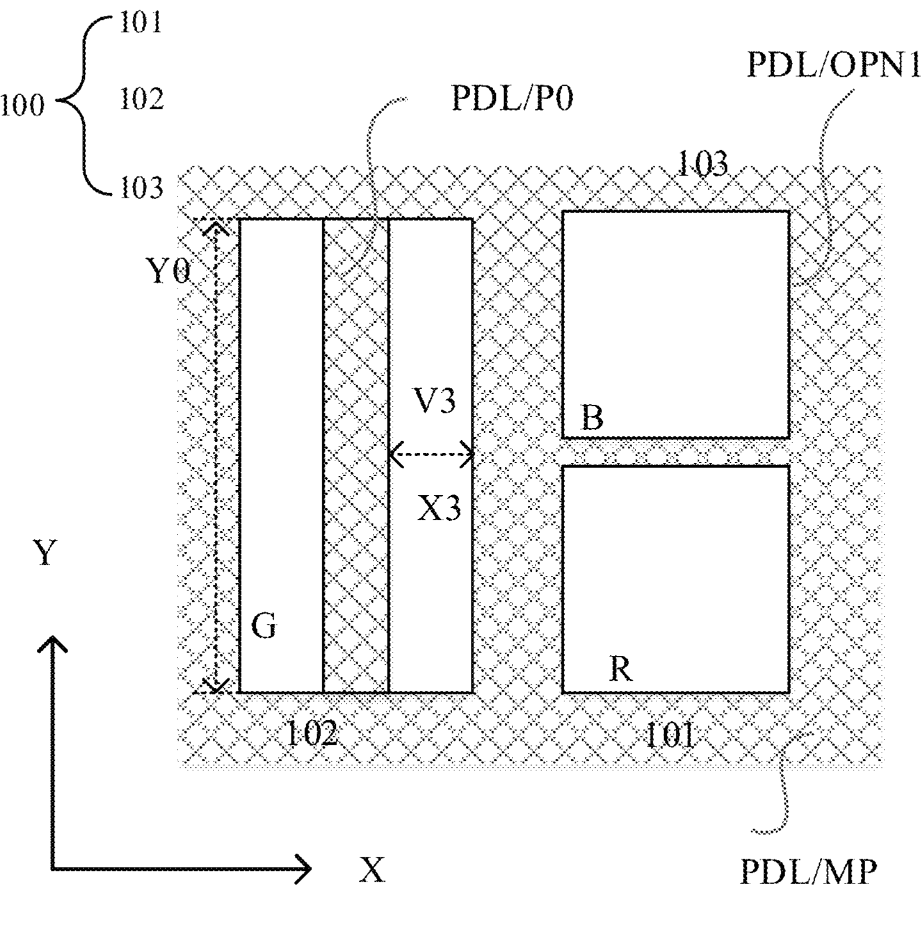
FIG. 14 is a top view of a pixel structure of a display panel provided by another embodiment of the present disclosure.

FIG. 13 is a top view of a pixel structure of a display panel provided by an embodiment of the present disclosure. FIG. 14 is a top view of a pixel structure of a display panel provided by another embodiment of the present disclosure.

Figure 15:
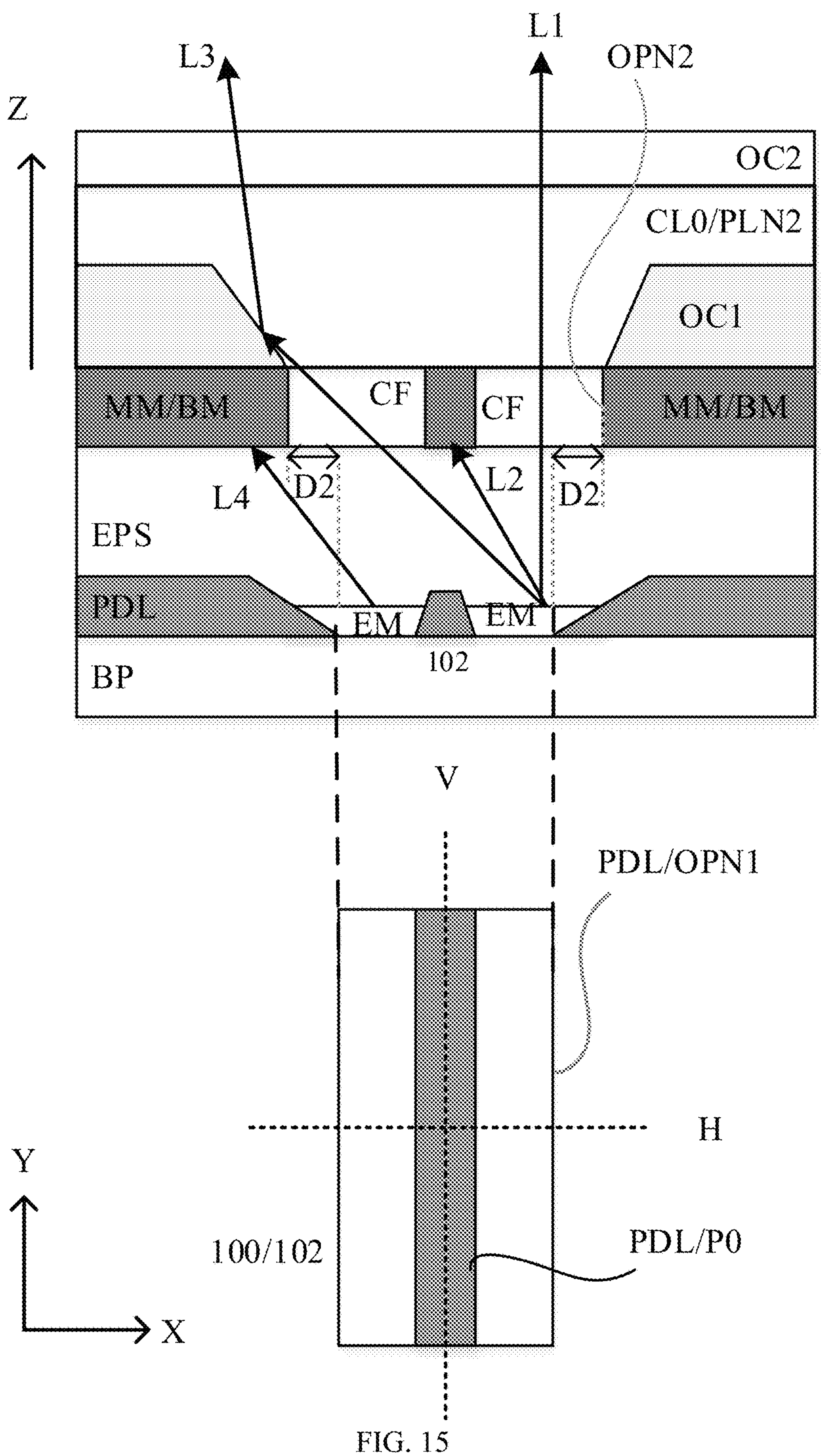
FIG. 15 is a sectional view of a sub-pixel having a maximum size and a schematic diagram of a light path thereof in a display panel provided by an embodiment of the present disclosure.
Figure 16:
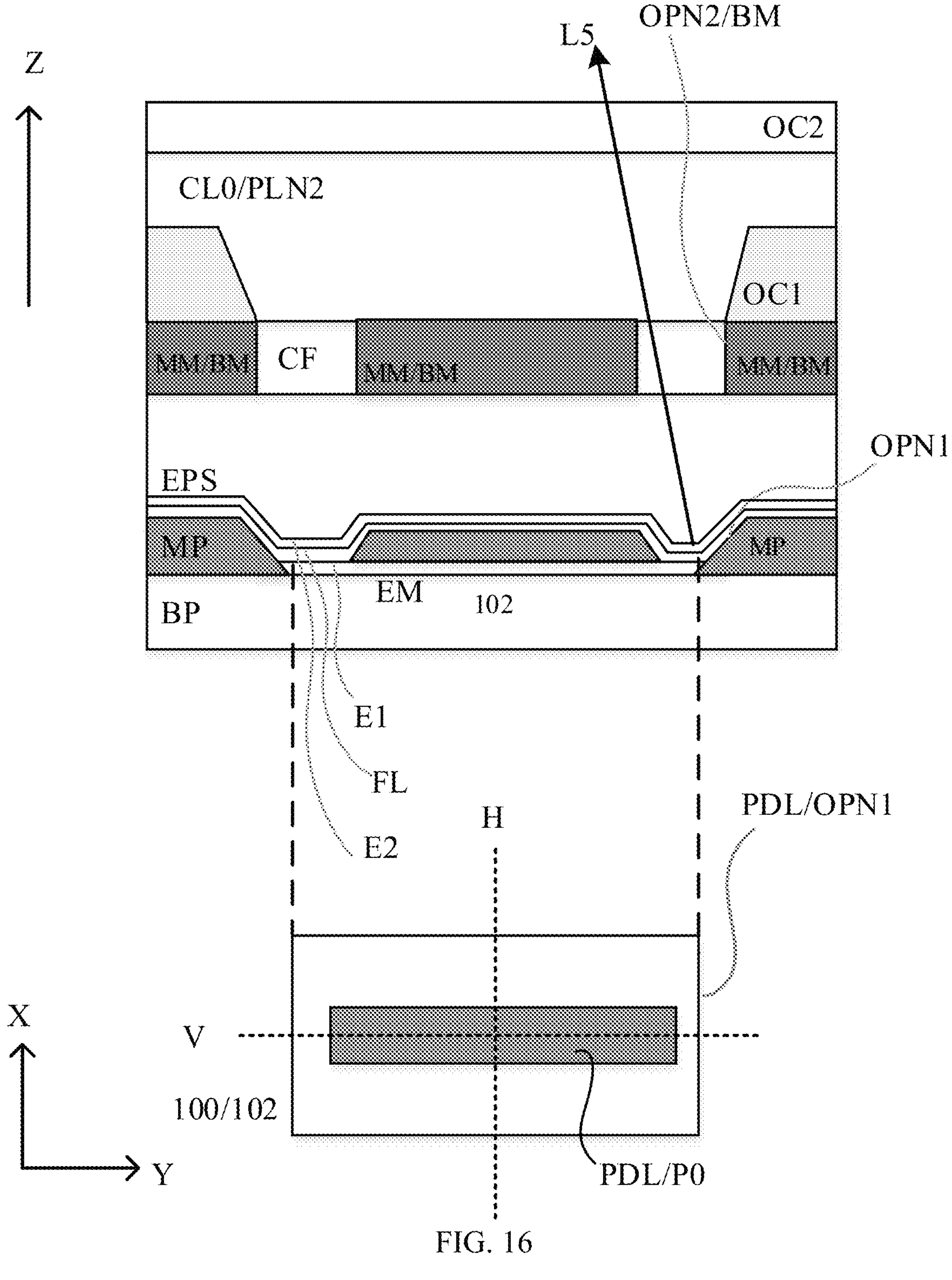
FIG. 16 is a sectional view of a sub-pixel having a maximum size and a schematic diagram of a light path thereof in another display panel provided by an embodiment of the present disclosure.

FIG. 15 is a sectional view of a sub-pixel having a maximum size and a schematic diagram of a light path thereof in a display panel provided by an embodiment of the present disclosure. FIG. 16 is a sectional view of a sub-pixel having a maximum size and a schematic diagram of a light path thereof in another display panel provided by an embodiment of the present disclosure.

For example, as shown in FIG. 13 to FIG. 16, in the display panels provided by the embodiments of the present disclosure, the display panel further includes a pixel defining layer PDL. The pixel defining layer PDL is configured to define the pixel openings OPN1. The pixel defining layer PDL includes a pixel segmenting portion P0. An orthographic projection of the pixel segmenting portion P0 on the base substrate BS overlaps an orthographic projection of the pixel opening OPN1 of the sub-pixel 100 having the maximum size on the base substrate BS.

As shown in FIG. 13 to FIG. 14, the pixel defining layer PDL includes a main body portion MP, pixel openings OPN1, and the pixel segmenting portion P0. The pixel segmenting portion P0 and the main body portion MP may be formed from the same material layer by the same patterning process.

As shown in FIG. 13 to FIG. 14, the second sub-pixel 102 is the sub-pixel 100 having the maximum size. The second sub-pixel 102 is segmented by the pixel segmenting portion P0. As shown in FIG. 13 to FIG. 14, the size of the third sub-pixel 103 may be greater than or equal to that of the first sub-pixel 101. As shown in FIG. 13 to FIG. 14, the size of the second sub-pixel 102 is greater than that of the third sub-pixel 103, and the size of the third sub-pixel 103 is greater than that of the first sub-pixel 101.

For example, as shown in FIG. 13 and FIG. 14, in the display panels provided by the embodiments of the present disclosure, the pixel opening OPN1 of the sub-pixel 100 having the maximum size is rectangular. As shown in FIG. 13 and FIG. 14, the pixel opening OPN1 of the second sub-pixel 102 is rectangular. As shown in FIG. 13 and FIG. 14, the pixel opening OPN1 of the first sub-pixel 101 is rectangular. As shown in FIG. 13 and FIG. 14, the pixel opening OPN1 of the third sub-pixel 103 is rectangular.

For example, as shown in FIG. 13 and FIG. 14, in the display panels provided by the embodiments of the present disclosure, a size Y0 of a long edge of the pixel opening OPN1 of the sub-pixel 100 having the maximum size is greater than 30 μm.

For example, as shown in FIG. 13, in the display panel provided by the embodiment of the present disclosure, the pixel opening OPN1 of the sub-pixel 100 having the maximum size is partially segmented by the pixel segmenting portion P0, and the pixel segmenting portion P0 has a first gap V1 from an edge, in direction X, of the pixel opening OPN1 and a second gap V2 from an edge, in direction Y, of the pixel opening OPN1, where the direction X is perpendicular to the direction Y.

For example, as shown in FIG. 13, in the display panel provided by the embodiment of the present disclosure, the first gap V1 is larger than the second gap V2.

For example, as shown in FIG. 13, in the display panel provided by the embodiment of the present disclosure, the first gap V1 (distance X1) is in a range of 5-10 μm, and the second gap V2 (distance Y1) is in a range of 3-5 μm.

As shown in FIG. 13, the pixel segmenting portion P0 is spaced apart from the main body portion MP.

For example, as shown in FIG. 14, in the display panel provided by the embodiment of the present disclosure, the pixel opening OPN1 of the sub-pixel 100 having the maximum size is completely segmented by the pixel segmenting portion P0, and a distance X3 between the pixel segmenting portion P0 and an edge, in direction X, of the pixel opening OPN1 is greater than a distance between the pixel segmenting portion P0 and an edge, in direction Y, of the pixel opening OPN1, where the direction X is perpendicular to the direction Y. As shown in FIG. 14, the distance between the pixel segmenting portion P0 and the edge, in the direction Y, of the pixel opening OPN1 is 0. The pixel segmenting portion P0 has a third gap V3 from the edge, in the direction X, of the pixel opening OPN1.

As shown in FIG. 14, the pixel segmenting portion P0 and the main body portion MP may be of an integrated structure.

For example, as shown in FIG. 13 and FIG. 14, in the display panels provided by the embodiments of the present disclosure, the first sub-pixel 101 and the third sub-pixel 103 are located on the same side of the second sub-pixel 102. For example, the first sub-pixel 101 and the third sub-pixel 103 are arranged in an extension direction of the second sub-pixel 102, but not limited thereto. The shapes of the first sub-pixel 101, the second sub-pixel 102, and the third sub-pixel 103 are not limited to a rectangle, and may also be a circle or a roughly circular shape. As shown in FIG. 13 and FIG. 14, the pixel opening OPN1 of the second sub-pixel 102 is greater than the pixel opening OPN1 of the first sub-pixel 101 and greater than the pixel opening OPN1 of the third sub-pixel 103. The display panel further includes the pixel defining layer PDL. The pixel defining layer PDL is configured to define the pixel openings OPN1. The pixel defining layer PDL includes the pixel segmenting portion P0. The orthographic projection of the pixel segmenting portion P0 on the base substrate BS overlaps the orthographic projection of the pixel opening OPN1 of the sub-pixel 100 having the maximum size on the base substrate BS. The pixel opening OPN1 of the sub-pixel 100 having the maximum size is completely segmented by the pixel segmenting portion P0, and the distance X3 between the pixel segmenting portion P0 and the edge, in the direction X, of the pixel opening OPN1 is greater than the distance between the pixel segmenting portion P0 and the edge, in the direction Y, of the pixel opening OPN1; or, the pixel opening OPN1 of the sub-pixel 100 having the maximum size is partially segmented by the pixel segmenting portion P0, and the pixel segmenting portion P0 has the first gap V1 from the edge, in the direction X, of the pixel opening OPN1 and has the second gap V2 from the edge, in the direction Y, of the pixel opening OPN1, where the direction X is perpendicular to the direction Y.

As shown in FIG. 13 to FIG. 16, the second sub-pixel 102 is segmented by the pixel segmenting portion P0, but it also corresponds to a light-emitting element which is driven by one pixel circuit.

For example, as shown in FIG. 15 and FIG. 16, in the display panels provided by the embodiments of the present disclosure, the orthographic projection of the pixel segmenting portion P0 on the base substrate BS overlaps an orthographic projection of the main body portion MM of the black matrix BM on the base substrate BS.

FIG. 16 illustrates the light-emitting element EM including the first electrode E1, the second electrode E2, and the light-emitting functional layer FL located between the first electrode E1 and the second electrode E2. FIG. 15 does not illustrate the specific structure of the light-emitting element EM, and a reference may be made to the structures in other figures.

For example, in an embodiment of the present disclosure, the first electrode E1 is a positive electrode and the second electrode E2 is a negative electrode, but they are not limited thereto.

For example, as shown in FIG. 15 and FIG. 16, in the display panels provided by the embodiments of the present disclosure, the size of the opening OPN2 of the black matrix BM is greater than 0 and less than or equal to 2 μm. As a matter of course, other suitable values may also be possible.

Figure 17:
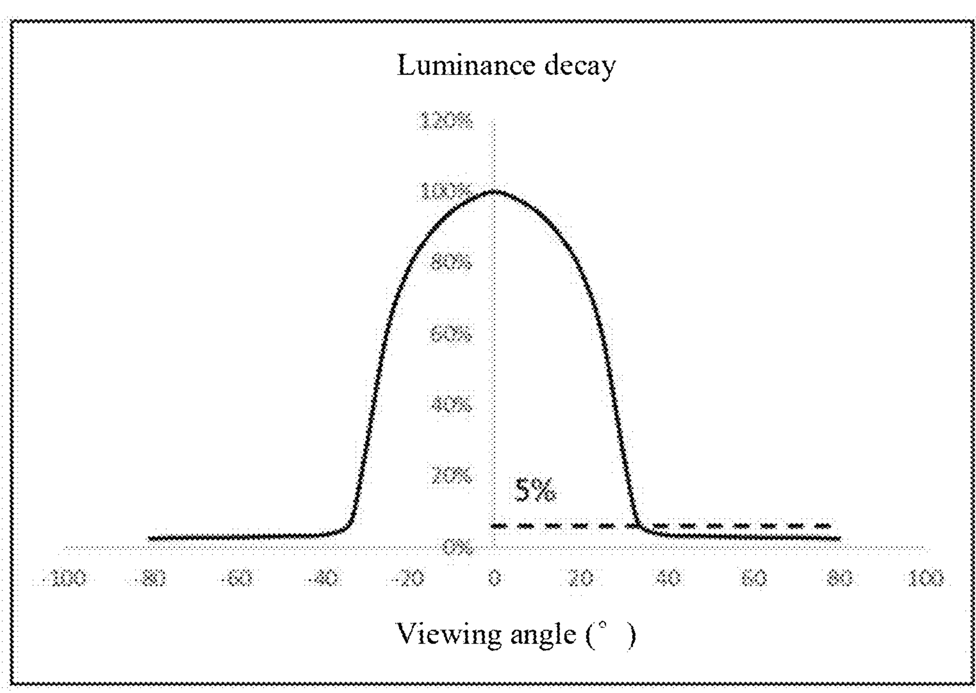
FIG. 17 is a schematic diagram of white light decays, in a horizontal direction, of the display panels provided in FIG. 13 and FIG. 15.
Figure 18:
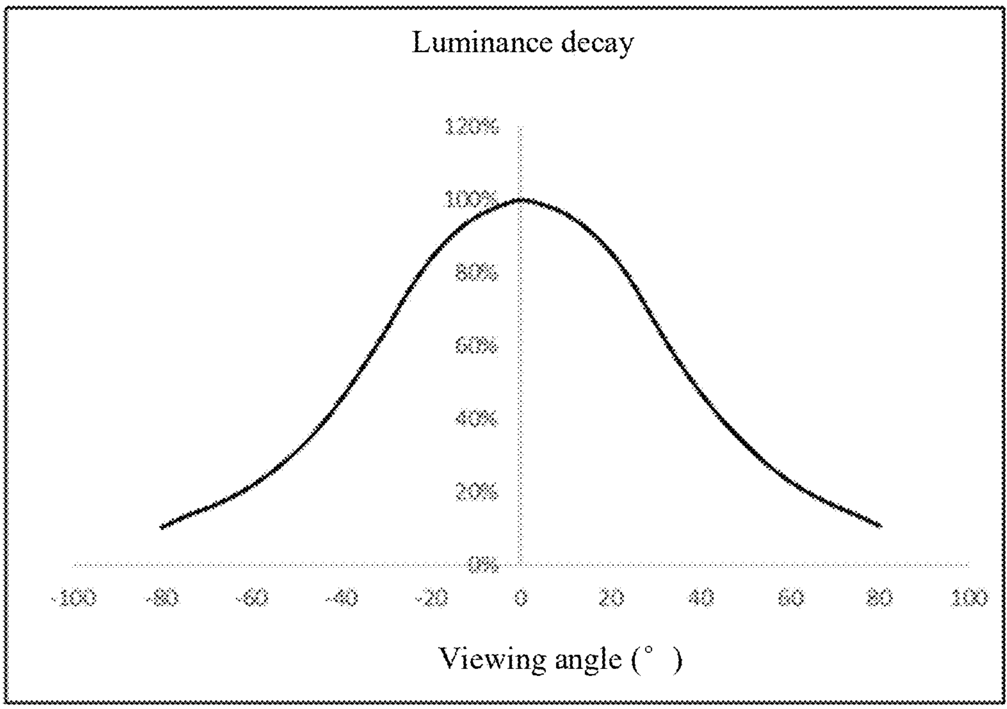
FIG. 18 is a schematic diagram of white light decays, in a vertical direction, of the display panels provided in FIG. 13 and FIG. 15.

FIG. 17 is a schematic diagram of white light decays, in a horizontal direction, of the display panels provided in FIG. 13 and FIG. 15. FIG. 18 is a schematic diagram of white light decays, in a vertical direction, of the display panels provided in FIG. 13 and FIG. 15. For example, the display panels provided by the embodiments of the present disclosure may be, but not limited to, a vehicle-mounted display panel.

For example, as shown in FIG. 17 and FIG. 18, in the display panels provided by the embodiments of the present disclosure, at a viewing angle of the same value, a luminance decay in a vertical direction V is less than a luminance decay in a horizontal direction H. That is, the luminance decay degree in the horizontal direction H is greater. For example, at the 0° viewing angle, the luminance of the display panel is SS. At the same viewing angle, the luminance of the display panel in the vertical direction is SS1, while the luminance of the display panel in the horizontal direction is SS2, and SS1/SS is greater than SS2/SS. In the vehicle-mounted display panel, in this way, the luminance decay degree in the vertical direction V may be caused to be lower than that in the horizontal direction H, which is beneficial for a driver to see the display panel clearly. For example, one of the vertical direction of the display panel and the horizontal direction of the display panel is the length direction of the display panel, and the other one of the vertical direction of the display panel and the horizontal direction of the display panel is the width direction of the display panel.

For example, as shown in FIG. 17, in the display panel provided by the embodiment of the present disclosure, in the horizontal direction H, the luminance at a viewing angle of greater than 35° decays to below 5% of the luminance at the 0° viewing angle. In this case, a person sitting on the passenger seat cannot see the content displayed on the display panel clearly.

The luminance decay of the display panel shown in FIG. 16 in the vertical direction V is less than the luminance decay of the display panel shown in FIG. 15 in the vertical direction V.

For example, in an embodiment of the present disclosure, the horizontal direction H is parallel to the direction X, and the vertical direction is parallel to the direction Y.

For example, the display panels provided by the embodiments of the present disclosure may be a vehicle-mounted product, i.e., a vehicle-mounted display panel. Using the relation formula of an extent to which the COE structure influences a luminance decay (L-decay):

$$\alpha_j = \frac{A - D2_j}{Dj},$$

a vehicle-mounted display panel capable of realizing the functional of an in-cell light control film (LCF) can be designed. FIG. 13 and FIG. 14 are top views of two pixel structures of the vehicle-mounted display panel, and the pixel structures are of Real RGB arrangement. Among the sub-pixels of three colors, the second sub-pixel 102 (the green sub-pixel, G) has the largest area and the middle of the second sub-pixel 102 is segmented by the pixel segmenting portion P0 of the pixel defining layer PDL. This structure can be realized by adjusting a mask of the pixel defining layer PDL.

As shown in FIG. 13 and FIG. 14, the pixel segmenting portion P0 has a width of about 6 μm (determined by the process capability), a distance X1, from a long edge of the pixel opening, of about 5-10 μm, and a distance, from a short edge Y1 of the pixel opening, of about 3-5 μm. The pixel structure shown in FIG. 14 is similar to the pixel structure shown in FIG. 13. The second sub-pixel 102 (the green sub-pixel, G) is completely segmented by the pixel segmenting portion P0.

As shown in FIG. 13 and FIG. 14, the width (the size in the direction X) of the second sub-pixel 102 is, but not limited to, about 16-26 μm.

For example, as shown in FIG. 15 and FIG. 16, the display panel (vehicle-mounted display panel), while integrated with the COE structure, may be added with a light gathering layer CL0 to converge light at a side viewing angle to emit at a front viewing angle, thereby further reducing light exiting at the side viewing angle. For example, the light gathering layer CL0 includes an optical clear adhesive layer OC1 and a planarization layer PLN2. The display panel (vehicle-mounted display panel) further includes an optical clear adhesive layer OC2. The optical clear adhesive layer OC1 is closer to the black matrix BM than the optical clear adhesive layer OC2. For example, the refractive index of the planarization layer PLN2 is greater than that of the optical clear adhesive layer OC1. The planarization layer PLN2 may be a film layer with a high refractive index. For example, a material of the planarization layer PLN2 includes a resin. The resin includes, but is not limited to, an acrylic resin or an epoxy resin. For example, the planarization layer PLN2 may be made of, but not limited to, an acrylic resin doped with filler particles or an epoxy resin doped with filler particles. For example, a particle size of the filler particles is at a nano-level. For example, the filler particles may be, but not limited to, zirconium oxide. For example, the refractive index of the optical clear adhesive layer OC1 is less than that of the planarization layer PLN2 so that light is totally reflected off the optical clear adhesive layer OC1. As shown in FIG. 15 and FIG. 16, light incident on a side surface of the optical clear adhesive layer OC1 is totally reflected at an interface of the optical clear adhesive layer OC1 and the planarization layer PLN2, thereby facilitating emission of light at a front viewing angle. For example, a material of the light gathering layer CL0 includes an organic material. A material of the optical clear adhesive layer OC1 and the optical clear adhesive layer OC2 includes, but is not limited to, a transparent organic material.

As shown in FIG. 15 and FIG. 16, after the completion of encapsulation with the encapsulation layer EPS, the COE and light gathering layer structures are arranged orderly thereabove. For example, as shown in FIG. 15 and FIG. 16, the opening OPN2 of the black matrix BM is, but not limited to, about greater than 0 and less than or equal to 2 μm.

As shown in FIG. 15 and FIG. 16, light at the front viewing angle and a small viewing angle may exit through the color filter layer and the light gathering layer without being influenced, as shown by a light path L1 in the figures. As the viewing angle increases, as shown by a light path L2 in the figures, most of light at the viewing angle is absorbed by the black matrix BM directly above the sub-pixel. As the viewing angle further increases, obliquely exiting light passes through the color filter layer CF to the optical clear adhesive layer OC1 (a film layer with a low refractive index) of the light gathering layer CL0 and is reflected into light at a small viewing angle, as shown by a light path L3 in the figures. The other part of light at a large viewing angle (e.g., a viewing angle of greater than 30°) is absorbed by the black matrix BM on two sides of the sub-pixel, as shown by a light path L4 in the figures. Because the sub-pixel is segmented in the horizontal direction H, in the influence of the black matrix BM on the luminance decay (L-decay), the size of the sub-pixel is reduced to 5-10 μm, and the extent to which the black matrix BM influences the luminance decay (L-decay) in the horizontal direction H is enhanced significantly. FIG. 16 illustrates a light path L5. As a matter of course, the sub-pixel in FIG. 16 may also be segmented completely, i.e., there is no light-exiting portion left on the left and right sides of the pixel segmenting portion P0.

For example, as shown in FIG. 4, FIG. 15, and FIG. 16, the thickness of the second encapsulation thin-film EPS2 of the encapsulation layer EPS may be increased to further enhance the extent to which the black matrix M influences the luminance decay (L-decay) in the horizontal direction H. The structure of the encapsulation layer EPS in FIG. 15 and FIG. 16 may be as shown in FIG. 4.

Referring to FIG. 13 and FIG. 14, because the size Y0 of the long edge of the pixel opening of the sub-pixel is large (greater than 30 μm), the extent to which the black matrix M influences the luminance decay (L-decay) is reduced significantly. The luminance is influenced only at the position where the sub-pixel is segmented. The influence of the black matrix BM on an overall luminance decay (L-decay) may be neglected, and the luminance decay at a viewing angle in the vertical direction V is slowed down.

As shown in FIG. 17, the luminance decay at a viewing angle in the horizontal direction H is rapid. When the viewing angle is greater than 35°, the luminance decays to below 5%. As shown in FIG. 18, the luminance decay at a viewing angle in the vertical direction V is slow, and the display panel (screen) can still be seen clearly at a large viewing angle.

An embodiment of the present disclosure further provides a display device including any display panel described above.

For example, the display device includes, but is not limited to, a vehicle-mounted display device.

An embodiment of the present disclosure further provides a manufacturing method of the display panel, including forming a plurality of pixels PX, forming the pixel PX includes forming a plurality of sub-pixels 100. Each sub-pixel 100 has a pixel opening OPN1. The plurality of sub-pixels 100 include a first sub-pixel 101, a second sub-pixel 102, and a third sub-pixel 103. Among the first sub-pixel 101, the second sub-pixel 102, and the third sub-pixel 103, a size of the pixel opening OPN1 of the sub-pixel 100 having a maximum size is Dmax and a size of the pixel opening OPN1 of the sub-pixel 100 having a minimum size is Dmin, and the display panel meets: max/Dmin≤y, y=0.02*Dmin+0.85, where y is a coefficient.

In the manufacturing method of the display panel provided by the embodiment of the present disclosure, matching is performed on a size ratio for sizes of different sub-pixels, thereby improving the optical properties at viewing angles and the chromaticity lifetime of the display panel.

For example, in the manufacturing method of the display panel provided by the embodiment of the present disclosure, the sub-pixel 100 includes a light-emitting element EM, and a size of the pixel opening OPN1 is D. The manufacturing method of the display panel further includes forming an encapsulation layer EPS, a black matrix BM, and a color filter layer CF, the encapsulation layer EPS is configured to encapsulate the light-emitting element EM; the black matrix BM and the color filter layer CF are located on the encapsulation layer EPS; the black matrix BM has an opening; an orthographic projection of the pixel opening OPN1 on the base substrate BS falls within an orthographic projection of the opening of the black matrix BM on the base substrate BS, and a distance between the orthographic projection of the pixel opening OPN1 on the base substrate BS and the orthographic projection of the opening of the black matrix BM on the base substrate BS is D2; an offset distance of light emitted from the light-emitting element EM is D1, and the manufacturing method of the display panel meets:

$$\alpha = \frac{D1 - D2}{D},$$

where α refers to an extent to which the light emitted from the light-emitting element EM is influenced by the black matrix BM. As can be known from the above formula, in the manufacturing method of the display panel provided by the embodiment of the present disclosure, the influence of the black matrix BM on the display panel may be reduced by adjusting at least one of the size D of the pixel opening OPN1, the offset distance D1, and the distance D2.

For example, in the manufacturing method of the display panel provided by the embodiment of the present disclosure, the following formula is met: $L_{\varphi 1}=(1-\alpha)*L_{\varphi 0}$, where $L_{\varphi 1}$ refers to a luminance for the manufacturing method of the display panel; $L_{\varphi 0}$ refers to a luminance of a structure obtained by removing the black matrix BM and the color filter layer CF in the manufacturing method of the display panel; and $\alpha$ refers to an extent to which the light emitted from the light-emitting element EM is influenced by the black matrix BM. $\alpha$ can be obtained by the above formula. The description on $\alpha$, $L_{\varphi 1}$, and $L_{\varphi 0}$ may be as presented above, which will not be redundantly repeated here.

For example, in the manufacturing method of the display panel provided by the embodiment of the present disclosure, $$D1 = \sum_{L1}^{Ln} d_i \tan\theta_i$$

where L1 refers to a film layer closest to a light-exiting side of the light-emitting element EM; Ln refers to the color filter layer CF; $d_i$ refers to a thickness of the $i^{th}$ film layer between the film layer L1 and the color filter layer Ln; $\theta_1$ refers to a refraction angle of light incident on the $i^{th}$ film layer; $1<i<n$, and $n>i$; i is a positive integer greater than 1, and n is a positive integer greater than 2. The description on the offset distance D1 may be as presented above, which will not be redundantly repeated here.

For example, in the manufacturing method of the display panel provided by the embodiment of the present disclosure, the size D of the pixel opening OPN1 is a length, a diameter, or an area of the pixel opening OPN1. In the manufacturing method, by defining the size D of the pixel opening OPN1 as the length, the diameter, or the area of the pixel opening OPN1, the parameters in the formula $Dmax/Dmin \leq 0.02*Dmin+0.85$ are further specified.

For example, in the manufacturing method of the display panel provided by the embodiment of the present disclosure, the shape of the pixel opening OPN1 includes a rectangle, a rounded rectangle, or a circle.

For example, in the manufacturing method of the display panel provided by the embodiment of the present disclosure, the first sub-pixel 101, the second sub-pixel 102, and the third sub-pixel 103 are configured to emit light different in color.

For example, in the manufacturing method of the display panel provided by the embodiment of the present disclosure, compared with the luminance at 0° viewing angle, the luminance at 30° viewing angle has a luminance decay of less than or equal to 26%.

For example, in the manufacturing method of the display panel provided by the embodiment of the present disclosure, compared with initial operation, the color difference of the white screen is less than 2.5 JNCD after the display panel obtained by the manufacturing method runs for 300 hours.

For example, as shown in FIG. 13 to FIG. 16, in the manufacturing method of the display panel provided by the embodiment of the present disclosure, the manufacturing method further includes forming a pixel defining layer PDL, the pixel defining layer PDL is configured to define the pixel openings OPN1; the pixel defining layer PDL includes a pixel segmenting portion P0; and an orthographic projection of the pixel segmenting portion P0 on the base substrate BS overlaps an orthographic projection of the pixel opening OPN1 of the sub-pixel 100 having the maximum size on the base substrate BS.

For example, as shown in FIG. 14 and FIG. 15, in the manufacturing method of the display panel provided by the embodiment of the present disclosure, the pixel opening OPN1 of the sub-pixel 100 having the maximum size is completely segmented by the pixel segmenting portion P0, and a distance X3 between the pixel segmenting portion P0 and an edge, in direction X, of the pixel opening OPN1 is greater than a distance (the distance is 0) between the pixel segmenting portion P0 and an edge, in direction Y, of the pixel opening OPN1, the direction X is perpendicular to the direction Y. For example, the distance X3 is, but not limited to, 5-10 μm.

For example, as shown in FIG. 13 and FIG. 15, in the manufacturing method of the display panel provided by the embodiment of the present disclosure, the pixel opening OPN1 of the sub-pixel 100 having the maximum size is partially segmented by the pixel segmenting portion P0, and the pixel segmenting portion P0 has a first gap V1 from an edge, in direction X, of the pixel opening OPN1 and a second gap V2 from an edge, in direction Y, of the pixel opening OPN1, and the direction X is perpendicular to the direction Y.

For example, as shown in FIG. 13, in the manufacturing method of the display panel provided by the embodiment of the present disclosure, the first gap V1 is larger than the second gap V2.

For example, in the manufacturing method of the display panel provided by the embodiment of the present disclosure, the first gap V1 is in a range of 5-10 μm, and the second gap V2 is in a range of 3-5 μm.

For example, in the manufacturing method of the display panel provided by the embodiment of the present disclosure, the pixel opening OPN1 of the sub-pixel 100 having the maximum size is, but not limited to, rectangular.

For example, as shown in FIG. 13 and FIG. 14, in the manufacturing method of the display panel provided by the embodiment of the present disclosure, a size of a long edge of the pixel opening OPN1 of the sub-pixel 100 having the maximum size is greater than 30 μm.

For example, as shown in FIG. 15 and FIG. 16, in the manufacturing method of the display panel provided by the embodiment of the present disclosure, the size Y0 of the opening OPN2 of the black matrix BM is greater than 0 and less than or equal to 2 μm.

For example, in the manufacturing method of the display panel provided by the embodiment of the present disclosure, at a viewing angle of the same value, a luminance decay in a vertical direction is less than a luminance decay in a horizontal direction.

For example, as shown in FIG. 17, in the manufacturing method of the display panel provided by the embodiment of the present disclosure, in the horizontal direction H, the luminance at a viewing angle of greater than 35° decays to below 5% of the luminance at the 0° viewing angle.

For example, in the manufacturing method of the display panel provided by an embodiment of the present disclosure, the sub-pixel 100 includes a light-emitting element EM, and a size of the pixel opening OPN1 is D. The manufacturing method of the display panel further includes forming an encapsulation layer EPS, a black matrix BM, and a color filter layer CF, the encapsulation layer EPS is configured to encapsulate the light-emitting element EM; the black matrix BM and the color filter layer CF are located on the encapsulation layer EPS; the black matrix BM has openings; an orthographic projection of the pixel opening OPN1 on the base substrate BS falls within an orthographic projection of the opening of the black matrix BM on the base substrate BS, and a distance between the orthographic projection of the pixel opening OPN1 on the base substrate BS and the orthographic projection of the opening of the black matrix BM on the base substrate BS is D2; and the values of at least two of the distance D2 of the first sub-pixel 101, the distance D2 of the second sub-pixel 102, and the distance D2 of the third sub-pixel 103 are different. The distances D2 of different sub-pixels may be set as needed.

Due to the inherent disadvantages of the COE structure, the properties at viewing angles of the display panel are caused to degrade and a color shift at a viewing angle is caused to become worse. The embodiments of the present disclosure provide a display panel, a manufacturing method thereof, and a display device. By designing a size relationship and/or a pixel structure of sub-pixels, a matching is performed according to a relative relationship of a luminance decay at a viewing angle for a POL product to a pixel size and a luminance decay at a viewing angle for the integrated COE structure, thus obtaining the display panel with good optical properties at viewing angles.

For example, according to an influencing factor of the black matrix (BM) on a luminance decay at a viewing angle, the embodiments of the present disclosure provide a display panel, a manufacturing method thereof, and a display device. By designing a size relationship and/or a pixel structure of sub-pixels, a matching is performed according to a relative relationship of a luminance decay at a viewing angle for a POL product to a pixel size and a luminance decay at a viewing angle for the integrated COE structure, thus obtaining the display panel with good optical properties at viewing angles. Meanwhile, the function of the light control film (LCF) of the vehicle-mounted screen may also be realized. The light control film may solve the problem of inverted imaging of a large-size display panel on the windshield of a vehicle by controlling a light-exiting direction of light.

In some figures of the embodiments of the present disclosure, plan views show direction Y and direction X, and cross-sectional views show direction Z. Both of the direction Y and the direction X are directions parallel to a main surface of the base substrate BS. The direction Z is a direction perpendicular to the main surface of the base substrate BS. The direction Z is perpendicular to the direction X and perpendicular to the direction Y. For example, the direction Y intersects with the direction X. The embodiments of the present disclosure are illustrated by taking as an example that the direction Y is perpendicular to the direction X. As shown in the cross-sectional views, the main surface of the base substrate BS is a surface, on which various elements are manufactured, of the base substrate BS. As shown in the cross-sectional views, an upper surface of the base substrate BS is the main surface of the base substrate BS.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising a plurality of pixels located on a base substrate, wherein each of the plurality of pixels comprises a plurality of sub-pixels, and each of the plurality of sub-pixels has a pixel opening, the plurality of sub-pixels comprise a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets:

$$D\max/D\min \le y,$$

y=0.02*Dmin+0.85, where y is a coefficient.

2. The display panel according to claim 1, wherein the sub-pixel comprises a light-emitting element, and a size of the pixel opening is D, the display panel further comprises an encapsulation layer, a black matrix, and a color filter layer, wherein the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate in a length direction or a width direction of the display panel is D2, an offset distance of light emitted from the light-emitting element is D1, and the display panel meets:

$$\alpha = \frac{D1 - D2}{D},$$

where α refers to an extent to which the light emitted from the light-emitting element is influenced by the black matrix.

3. The display panel according to claim 2, wherein the display panel meets:

$$L_{\varphi 1} = (1 - \alpha) * L_{\varphi 0},$$

where $L_{\varphi 1}$ refers to a luminance of the display panel, and $L_{\varphi 0}$ refers to a luminance of a structure obtained by removing the black matrix and the color filter layer from the display panel.

4. The display panel according to claim 2, wherein $$D1 = \sum_{L1}^{Ln} d_i \tan\theta_i,$$

where L1 refers to a film layer closest to a light-exiting side of the light-emitting element, Ln refers to the color filter layer, $d_i$ refers to a thickness of the $i^{th}$ film layer between the film layer L1 and the film layer Ln, $\theta_i$ refers to a refraction angle of light incident on the $i^{th}$ film layer, 1<i<n, and n>i, i is a positive integer greater than 1, and n is a positive integer greater than 2.

5. The display panel according to claim 2, wherein the size D of the pixel opening of the first sub-pixel is different from the size D of the pixel opening of the second sub-pixel, the offset distance D1 of the first sub-pixel is different from the offset distance D1 of the second sub-pixel, and the distance D2 of the first sub-pixel is different from the distance D2 of the second sub-pixel.

6. The display panel according to claim 1, wherein compared with a luminance at 0° viewing angle, a luminance at 30° viewing angle has a luminance decay of less than or equal to 26%.

7. The display panel according to claim 1, wherein compared with initial operation, a color difference of a white screen is less than 2.5 JNCD after the display panel operates for 300 hours.

8. The display panel according to claim 1, further comprising a pixel defining layer, wherein the pixel defining layer is configured to define the pixel opening and comprises a pixel segmenting portion, and an orthographic projection of the pixel segmenting portion on the base substrate overlaps an orthographic projection of the pixel opening of the sub-pixel having the maximum size on the base substrate.

9. The display panel according to claim 8, wherein the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, wherein the first direction is perpendicular to the second direction.

10. The display panel according to claim 8, wherein the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, wherein the first direction is perpendicular to the second direction, wherein the first gap is larger than the second gap.

11. The display panel according to claim 2, wherein the first sub-pixel and the third sub-pixel are located on a same side of the second sub-pixel, the pixel opening of the second sub-pixel is larger than the pixel opening of the first sub-pixel and larger than the pixel opening of the third sub-pixel, the display panel further comprises a pixel defining layer, the pixel defining layer is configured to define the pixel opening and comprises a pixel segmenting portion, an orthographic projection of the pixel segmenting portion on the base substrate overlaps an orthographic projection of the pixel opening of the sub-pixel having the maximum size on the base substrate, the pixel opening of the sub-pixel having the maximum size is completely segmented by the pixel segmenting portion, and a distance between the pixel segmenting portion and an edge, in a first direction, of the pixel opening is greater than a distance between the pixel segmenting portion and an edge, in a second direction, of the pixel opening, or the pixel opening of the sub-pixel having the maximum size is partially segmented by the pixel segmenting portion, and the pixel segmenting portion has a first gap from an edge, in a first direction, of the pixel opening and a second gap from an edge, in a second direction, of the pixel opening, wherein the first direction is perpendicular to the second direction.

12. The display panel according to claim 1, wherein at 0° viewing angle, the luminance of the display panel is SS, and at a same viewing angle, the luminance of the display panel in a vertical direction is SS1, while the luminance of the display panel in a horizontal direction is SS2, and SS1/SS is greater than SS2/SS.

13. The display panel according to claim 1, wherein in the horizontal direction, the luminance at a viewing angle of greater than 35° decays to below 5% of the luminance at 0° viewing angle.

14. The display panel according to claim 1, wherein the sub-pixel comprises a light-emitting element, and a size of the pixel opening is D, the display panel further comprises an encapsulation layer, a black matrix, and a color filter layer, wherein the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and values of at least two of the distance D2 of the first sub-pixel, the distance D2 of the second sub-pixel, and the distance D2 of the third sub-pixel are different.

15. A vehicle-mounted display panel, comprising a plurality of pixels, wherein each of the plurality of pixels comprises a plurality of sub-pixels, and each of the plurality of sub-pixels has a pixel opening, the plurality of sub-pixels comprise a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets:

$$Dmax/Dmin \leq y,$$

$$y = 0.02 * Dmin + 0.85,$$

where y is a coefficient.

16. The vehicle-mounted display panel according to claim 15, wherein the sub-pixel comprises a light-emitting element, and a size of the pixel opening is D, the vehicle-mounted display panel further comprises an encapsulation layer, a black matrix, and a color filter layer, wherein the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and an offset distance of light emitted from the light-emitting element is D1, and the vehicle-mounted display panel meets:

$$\alpha = \frac{D1 - D2}{D},$$

where α refers to an extent to which the light emitted from the light-emitting element is influenced by the black matrix.

17. The vehicle-mounted display panel according to claim 16, wherein the vehicle-mounted display panel meets:

$$L_{\varphi 1}=(1-\alpha)*L_{\varphi 0},$$

where $L_{\varphi 1}$ refers to a luminance of the vehicle-mounted display panel, and $L_{\varphi 0}$ refers to a luminance of a structure obtained by removing the black matrix and the color filter layer from the vehicle-mounted display panel.

18. A manufacturing method of a display panel, comprising forming a plurality of pixels, wherein forming each of the plurality of pixels comprises forming a plurality of sub-pixels, and each of the plurality of sub-pixels has a pixel opening, the plurality of sub-pixels comprise a first sub-pixel, a second sub-pixel, and a third sub-pixel, among the first sub-pixel, the second sub-pixel, and the third sub-pixel, a size of the pixel opening of the sub-pixel having a maximum size is Dmax and a size of the pixel opening of the sub-pixel having a minimum size is Dmin, and the display panel meets:

$$D\max/D\min \leq y,$$

$$y=0.02*D\min+0.85,$$

where y is a coefficient.

19. The manufacturing method of the display panel according to claim 18, wherein the sub-pixel comprises a light-emitting element, and a size of the pixel opening is D, the manufacturing method of the display panel further comprises forming an encapsulation layer, a black matrix, and a color filter layer, wherein the encapsulation layer is configured to encapsulate the light-emitting element, the black matrix and the color filter layer are located on the encapsulation layer, the black matrix has an opening, an orthographic projection of the pixel opening on the base substrate falls within an orthographic projection of the opening of the black matrix on the base substrate, and a distance between the orthographic projection of the pixel opening on the base substrate and the orthographic projection of the opening of the black matrix on the base substrate is D2, and an offset distance of light emitted from the light-emitting element is D1, and the manufacturing method of the display panel meets:

$$\alpha=\frac{D1-D2}{D},$$

where α refers to an extent to which the light emitted from the light-emitting element is influenced by the black matrix.

20. The manufacturing method of the display panel according to claim 19, wherein the manufacturing method of the display panel meets:

$$L_{\varphi 1}=(1-\alpha)*L_{\varphi 0},$$

where $L_{\varphi 1}$ refers to a luminance of the display panel obtained by the manufacturing method, and $L_{\varphi 0}$ refers to a luminance of a structure obtained by removing the black matrix and the color filter layer in the manufacturing method of the display panel.

* * * * *